United States Patent [19]
Gambino et al.

[11] Patent Number: 6,084,276
[45] Date of Patent: Jul. 4, 2000

[54] THRESHOLD VOLTAGE TAILORING OF CORNER OF MOSFET DEVICE

[75] Inventors: Jeffrey Peter Gambino, Gaylordsville, Conn.; Gary Bela Bronner; Jack Allan Mandelman, both of Stormville, N.Y.; Larry Alan Nesbit, Farmington, Conn.

[73] Assignee: International Business Machines Corporation, Armonk, N.Y.

[21] Appl. No.: 09/337,904

[22] Filed: Jun. 22, 1999

Related U.S. Application Data

[62] Division of application No. 08/788,065, Jan. 23, 1997, Pat. No. 5,994,202.

[51] Int. Cl.⁷ .............................. H01L 29/76; H01L 29/00
[52] U.S. Cl. .................. 257/397; 257/519; 257/513; 257/404; 257/394; 438/433; 438/296; 438/424; 438/430
[58] Field of Search .................... 257/519, 515, 257/514, 513, 404, 402, 397, 394, 368, 510, 354, 374, 386; 438/221, 217, 218, 433, 296

[56] References Cited

U.S. PATENT DOCUMENTS

| | | | |
|---|---|---|---|
| 4,577,395 | 3/1986 | Shibita | 438/386 |
| 4,589,193 | 5/1986 | Goth et al. | 438/430 |
| 4,654,120 | 3/1987 | Dougherty | 438/424 |
| 4,722,910 | 2/1988 | Yasaitis | 437/44 |
| 5,021,355 | 6/1991 | Dhong et al. | 437/35 |
| 5,059,550 | 10/1991 | Tateoka et al. | 438/432 |
| 5,212,106 | 5/1993 | Erb et al. | 437/45 |
| 5,215,937 | 6/1993 | Erb et al. | 437/45 |
| 5,229,316 | 7/1993 | Lee et al. | 438/424 |
| 5,258,332 | 11/1993 | Horioka et al. | 437/228 |
| 5,275,965 | 1/1994 | Manning | 437/67 |
| 5,281,550 | 1/1994 | Ducreau | 438/424 |
| 5,292,683 | 3/1994 | Dennison et al. | 438/296 |
| 5,298,110 | 3/1994 | Schoenborn et al. | 438/424 |
| 5,300,447 | 4/1994 | Anderson | 437/41 |
| 5,396,096 | 3/1995 | Akamatsu et al. | 257/336 |
| 5,408,116 | 4/1995 | Tanaka et al. | 257/327 |
| 5,413,945 | 5/1995 | Chien et al. | 437/35 |
| 5,482,878 | 1/1996 | Burger et al. | 437/41 |
| 5,506,168 | 4/1996 | Morita et al. | 438/424 |
| 5,521,422 | 5/1996 | Mandelmann et al. | 257/510 |
| 5,607,875 | 3/1997 | Nishizawa et al. | 438/404 |
| 5,677,229 | 10/1997 | Morita et al. | 438/433 |
| 5,741,738 | 4/1998 | Mandelman et al. | 438/296 |

FOREIGN PATENT DOCUMENTS 0 685 882 A1  5/1995  European Pat. Off. ........ H01L 21/76

OTHER PUBLICATIONS

Bryant et al, "Characteristics of CMOS Device Isolation for the ULSI Age", IEDM Tech. Dig., pp. 671–674 (1994).

K. Shibahara et al., "Trench Isolation with DEL(NABLA)—shaped Buried Oxide for 256Mega–bit DRAMS" IEDM 92, pp. 275–278 (1992).

G. Fuse, et al., "A Practical Trench Isolation Technology with a Novel Planarization Process" IEDM 87, pp. 732–735 (1987).

(List continued on next page.)

*Primary Examiner*—Tom Thomas
*Assistant Examiner*—Douglas W. Owens
*Attorney, Agent, or Firm*—Graham S. Jones, II; H. Daniel Schnurmann

[57] ABSTRACT

A semiconductor MOSFET device is formed on a silicon substrate which includes trenches filled with Shallow Trench Isolation dielectric trench fill structures and extending above the surface of the substrate. The trench fill structures have protruding sidewalls with channel regions in the substrate having corner regions adjacent to the trench fill structures. The channel regions are between and adjacent to the STI trench fill structures doped with one concentration of dopant in the centers of the channel regions with a higher concentration of dopant in the corner regions. The dopant concentration differential provides a substantially equal concentration of electrons in the centers and at the corner regions of the channel regions.

41 Claims, 12 Drawing Sheets

OTHER PUBLICATIONS

P.C. Fazan and V. K. Matthews, "A Highly Manufacturable Trench Isolation Process for Deep Submicron DRAMs", IEDM 93, pp. 57–60 (1993).

D. S. Wen, "Optimized Shallow Trench Isolation Structure and Its Process for Eliminating Shallow Trench Isolation–Induced Parasitic Effects" IBM Tech. Dis. Bull., pp. 276–277 (Apr., 1992).

B.E.E. Kastenmeier et al "Chemical Dry Etching of Silicon Nitride and Silicon Dioxide Using $CF_4/o_2/M_2$ Gas Mixtures", J. Vac. Sci. Technol. A 14(5) pp. 2802–2803 (Sep./Oct. 1996).

Bryant et al, "The Current–Carrying Corner Inherent to Trench Isolation" IEEE Electron Device Letters, vol. 14, No. 8 412–414 (1993).

THRESHOLD VOLTAGE TAILORING OF CORNER OF MOSFET DEVICE

This is a divisional of application Ser. No. 08/788,065 filed on Jan. 23, 1997 now U.S. Pat. No. 5,994,202.

BACKGROUND OF THE INVENTION

1. Field of the Invention

This invention relates to semiconductor devices and more particularly to MOSFET devices and a method of manufacture thereof.

2. Description of Related Art

Shallow Trench Isolation (STI) region structures are often used in advanced integrated circuits. The STI technique provides higher device densities and better planarity than other isolation methods. However, STI has a disadvantage in terms of device characteristics. Because of the steep slope of the silicon (Si) sidewall adjacent to an STI structure, an applied gate voltage results in an enhanced electric field at the corner of the active area. The field is further enhanced if the STI is recessed so that the gate wraps around the corner. The resulting "corner device" shown in FIG. 1 has a lower threshold voltage than the main device, which can lead to a high "off" current and to variations in the threshold voltage of the transistor as described by Bryant et al, in "Characteristics of CMOS Device Isolation for the ULSI Age", IEDM Tech. Dig., pp. 671–674 (1994). FIG. 1 shows a sectional view of a prior art semiconductor device 10 formed on a P– doped silicon substrate on which is formed a gate oxide layer GOX above a channel CH. To the right of the gate oxide layer is an isolation region STI separated from the lightly doped P– substrate 12 by a sidewall SW which forms a corner CR with a radius r and a corner angle CA of θ with the lower surface of the gate oxide layer GOX. To the right of the corner CR is formed a wraparound WR depression in the surface of the isolation region STI. Upon the gate oxide layer GOX and the isolation region STI is formed a doped polysilicon layer PS which is to serve as a gate electrode of an MOSFET (Metal Oxide Semiconductor Field Effect Transistor) device. As stated in Bryant et al in the legend for FIG. 1 thereof, "The abrupt geometric step of an Ideal Isolation edge results in the separate conduction characteristic of the corner parasitic. Corner radius, sidewall corner angle, and gate wraparound impact conduction."

A number of solutions have been proposed to solve this problem. One method is to simply ensure that the surface of the STI is always above that of the silicon as described in K. Shibahara et al., "Trench Isolation with DEL(NABLA)-shaped Buried Oxide for 256 Mega-bit DRAMS" IEDM, (1992) p. 275. However, this can create topography that makes gate patterning more difficult. (Rails can be left along the sidewalls of the protruding STI.)

Another method is to implant the appropriate dopants (i.e., B (Boron) for an N-channel FET (NFET)) into the sidewalls of the trench to increase the threshold voltage along the sidewall. However, this requires an extra blockout mask.

The prior art listed below relates to methods of minimizing the effect of the corner device, either by corner rounding or by doing implants into the sidewalls of the trenches.

In Evans et al. European Patent No. 0 685 882 A1 the sidewalls of the trenches are implanted to adjust the threshold voltage of the corner device, similar to G. Fuse, et al., "A Practical Trench Isolation Technology with a Novel Planarization Process" IEDM 87, pp. 732–735 (1987); and P. C. Fazan and V. K. Matthews, "A Highly Manufacturable Trench Isolation Process for Deep Submicron DRAMs", IEDM 93, pp. 57–60 (1993). The approach used by Evans depends on the isolation trench having sloping sidewalls. See the Abstract relative to threshold adjustment of isolation trench using doped sidewalls and bottom.

Horioka et al. U.S. Pat. No. 5,258,332 "Method of Manufacturing Semiconductor Devices Including Rounding of Corner Portions by Etching" and D. S. Wen, "Optimized Shallow Trench Isolation Structure and Its Process for Eliminating Shallow Trench Isolation-Induced Parasitic Effects" IBM Tech. Dis. Bull., pp. 276–277 (April, 1992) propose using corner rounding to control the corner device. In principle, this is a good method but it can be difficult to control. Horoika also shows implantation into the sidewall, as well as the corner.

Manning U.S. Pat. No. 5,275,965 proposes using gated sidewalls in the isolation region. This structure could have a detrimental effect on yield due to the presence of a conductor in the isolation region. Furthermore this approach suffers from added wiring complexity and the need to bias the NFET and P-channel FET (PFET) isolation trenches at different voltage levels. In particular, see the Abstract; Col. 3, lines 32–37 and lines 51–56. The device includes a channel adjusted for threshold by implanting. Sidewalls of the trench are "gated" to prevent parasitic turn-on.

Erb et al. U.S. Pat. No. 5,212,106 and Erb et al. U.S. Pat. No. 5,215,937 use sidewalls to make an threshold voltage implant that is self-aligned to the gate conductor. However, it is not self-aligned to the isolation region (as they point out) and therefore cannot be used to adjust the corner device. The reference mentions doing implants into the sidewalls of the trenches to control the corner device. Erb does not anticipate the problem solved by our invention.

Yasaitis U.S. Pat. No. 4,722,910 describes a sidewall formed along the isolation region to make a borderless contact. This has nothing to do with controlling a corner device.

Akamatsu et al. U.S. Pat. No. 5,396,096 describes a masked implant used to protect the edge of the isolation region from high electric fields. This is done after gate patterning and does not affect the corner device (but Akamatsu et al. does not anticipate the problem solved by the present invention.)

Burger et al. U.S. Pat. No. 5,482,878 describes threshold adjustment of implants using blocking masks.

Dhong et al. U.S. Pat. No. 5,021,355; Anderson U.S. Pat. No. 5,300,447; and Tanaka et al. U.S. Pat. No. 5,408,116 describe trench transistor devices.

Threshold adjustment using geometry of isolation trench corners is described in the Wen TDB article, Tanaka et al. U.S. Pat. No. 5,408,116 and Horioka et al. U.S. Pat. No. 5,258,332 referred to above.

Different implant levels on device using LOCOS isolation regions are discussed in U.S. Pat. No. 5,396,096 (Akamatsu et al.) and U.S. Pat. No. 4,722,910 (Yasaitis).

Using the corner of the trench gate to provide dopant is described in U.S. Pat. No. 5,300,447 (Anderson) and U.S. Pat. No. 5,021,355 (Dhong et al.).

SUMMARY OF THE INVENTION

None of the prior art cited above discusses the use of sidewalls along the isolation region to tailor the threshold voltage of the corner device.

The present invention teaches away from isolation trench sidewall doping since it is deleterious to device characteristics and is not required to solve the problem solved by the present invention which is corner conduction, not sidewall conduction.

The present invention teaches away from the approach of Evans et al. above in that it avoids doping the trench sidewalls. This invention is focussed only on corner doping augmentation.

In accordance with this invention a process is provided for fabricating a semiconductor MOSFET device on a silicon substrate. The steps include forming a mask with openings therethrough on the substrate. Etch down into the substrate through the openings in the mask to form trenches in the substrate. Form STI (Shallow Trench Isolation) dielectric trench fill structures of silicon dioxide in the trenches in the substrate and in the openings the mask. Strip the mask from the device leaving protruding sidewalls of the STI trench fill structures with channel regions in the substrate between the trench fill structures having corner regions adjacent to the STI trench fill structures. Dope the channel regions between and adjacent to the STI trench fill structures with one concentration of dopant in the centers of the channel regions, and a substantially higher concentration of dopant in the channel regions adjacent to the corner regions. The dopant concentration differential providing a substantially equal concentration of electrons in the centers and at the corner regions of the channel regions.

Preferably, for fabricating a semiconductor MOSFET device on a silicon substrate, form sidewall spacers along the protruding sidewalls of the STI trench fill structures above the corner regions of the channel regions leaving the centers of the channel regions exposed. Ion implant ions of a first type of dopant, as a compensating implant, into the centers of channel regions, the centers being located in the substrate aside from and between the STI region trench fill structures and the spacers. The compensating implant is made in the centers of the channel regions between the spacers to compensate for the threshold voltage implant except at the corner regions adjacent to the sidewalls of STI trench fill structures so that there will be higher effective doping in the corner regions after the step of doping with the spacers blocking the compensating implant at the corner regions of the device aside from the central channel regions. Strip the spacers from the device, and perform a threshold voltage doping process of ion implanting additional dopant into the channel regions including the corner regions whereby the corner regions have a higher dopant concentration than the centers of the channel regions.

Preferably, for fabricating a semiconductor MOSFET device on a silicon substrate the compensating doping implant involves ion implanting the arsenic ions at an energy from about 1 keV to about 100 keV with a dose from about 1 E 12 ions/cm$^2$ to about 2 E 13 ions/cm$^2$, and typically 60 keV with a dose of about 5 E 12 ions/cm$^2$; the peak of the arsenic compensating implant in the central channel regions is from about 100 Å to about 1,500 Å deep, typically about 450 Å deep below the surface of the substrate. Preferably, fabricate a semiconductor MOSFET device on a silicon substrate wherein the threshold voltage doping process involves ion implanting boron (B) ions at an energy from about 1 keV to about 50 keV with a dose from about 1 E 12 ions/cm$^2$ to about 5 E 13 ions/cm$^2$; the depth of the peak boron (B) concentration regions is from about 200 Å to about 2,000 Å; the energy is about 10 keV and the dose is about 8 E 12 ions/cm$^2$ and the peak boron (B) concentration regions is about 500 Å deep below the surface of the substrate; the peak concentration of P type dopant, comprises boron (B) atoms, produced in the channel regions in the substrate is from about 1 E 17 atoms/cm$^3$ to about 3 E 18 atoms/cm$^3$ with a preferred concentration of about 4 E 17 atoms/cm$^3$; and the arsenic doping in the channel regions has a concentration of about 1 E 17 atoms/cm$^3$, producing net phosphorus type doping in the center of the channels of about 3 E 17 atoms/cm$^3$, which is approximately 33% lower than the concentration at the corner regions which is about 4 E 17 atoms/cm$^3$.

Preferably, the method of this invention employs the following steps for fabricating a semiconductor MOSFET device on a silicon substrate. Form sidewall spacers along the protruding sidewalls of the STI trench fill structures above the corner regions of the channel regions the spacers having been doped with corner dopant. Diffuse the corner dopant from the spacers into the corner regions of NFET channel regions in the device, the centers being located in the substrate aside from and between the STI region trench fill structures and the spacers. Strip the spacers from the device. Then ion implant an opposite type of dopant into the channel regions including the corner regions whereby the corner regions have a higher effective dopant concentration of atoms of the opposite type of dopant. Preferably, the polysilicon spacers have been doped with P type boron (B) dopant with a concentration of boron (B) dopant atoms from about 1 E 19 atoms/cm$^3$ to about 5 E 20 atoms/cm$^3$; an annealing process is performed in a hydrogen (H$_2$) gas atmosphere with a source such as forming gas at a temperature from about 800° C. and about 900° C. from about 60 seconds to about 30 minutes; the resultant peak concentration of boron (B) dopant in the protected corner regions in the substrate beneath the spacers ranges from about 2 E 17 atoms/cm$^3$ to about 2 E 18 atoms/cm$^3$ and a concentration in the remainder of the substrate from about 1 E 17 atoms/cm$^3$ to about 1 E 18 atoms/cm$^3$ outside of the corner regions; the threshold voltage doping process involves ion implanting boron (B) ions into the substrate at an energy from about 1 keV to about 50 keV with a dose from about 1 E 12 ions/cm$^2$ to about 5 E 13 ions/cm$^2$, and the depth of the peak boron (B) concentration in the substrate is from about 200 Å to about 2,000 Å; the threshold voltage doping process involves ion implanting boron (B) ions into the substrate at an energy of about 10 keV with a dose of about 8 E 12 ions/cm$^2$, and the depth of the peak boron (B) concentration in the substrate is about 500 Å; after source/drain high temperature annealing of the device the concentration of P-type dopant, comprising boron (B) atoms, produced in the channel regions in substrate is from about 5 E 16 atoms/cm$^3$ to about 1 E 18 atoms/cm$^3$; the threshold voltage doping process involves ion implanting boron (B) ions into the substrate at an energy of about 10 keV with a dose of about 8 E 12 ions/cm$^2$, and the depth of the peak boron (B) concentration in the substrate is about 500 Å.

Preferably, for fabricating a semiconductor MOSFET device on a silicon substrate, form sidewall spacers along the protruding sidewalls of the openings in the mask. Then etching down into the substrate through the openings in the mask to form trenches in the substrate. Then form the STI (Shallow Trench Isolation) dielectric trench fill structures of silicon dioxide in the trenches in the substrate and in the openings the mask. Ion implant ions of a first type of dopant, as a compensating implant, into the centers of channel regions, the centers being located in the substrate aside from and between the STI region trench fill structures and the spacers, the compensating implant being made in the centers of the channel regions between the spacers to compensate for the threshold voltage implant except at the corner regions adjacent to the sidewalls of STI trench fill structures so that there will be higher effective doping in the corner regions after the step of doping with the spacers blocking the compensating implant at the corner regions of the device aside from the central channel regions. Strip the spacers from the device, and ion implant an opposite type of dopant into the channel regions including the corner regions whereby the corner regions have a higher effective dopant concentration of atoms of the opposite type of dopant. Preferably, for fabricating a semiconductor MOSFET device on a silicon substrate the compensating doping implant involves ion implanting the arsenic ions at an energy from about 1 keV to about 100 keV with a dose from about 1 E 12 ions/cm$^2$ to about 2 E 13 ions/cm$^2$, and typically 60 keV with a dose of about 5 E 12 ions/cm$^2$; the peak of the arsenic compensating implant in the central channel regions is from about 100 Å to about 1,500 Å deep, typically about 450 Å deep below the surface of the substrate. Preferably, fabricate a semiconductor MOSFET device on a silicon substrate wherein the threshold voltage doping process involves ion implanting boron (B) ions at an energy from about 1 keV to about 50 keV with a dose from about 1 E 12 ions/cm$^2$ to about 5 E 13 ions/cm$^2$; the depth of the peak boron (B) concentration regions is from about 200 Å to about 2,000 Å; the energy is about 10 keV and the dose is about 8 E 12 ions/cm$^2$ and the peak boron (B) concentration regions is about 500 Å deep below the surface of the substrate; the peak concentration of P type dopant, comprises boron (B) atoms, produced in the channel regions in the substrate is from about 1 E 17 atoms/cm$^3$ to about 3 E 18 atoms/cm$^3$ with a preferred concentration of about 4 E 17 atoms/cm$^3$; and the arsenic doping in the channel regions has a concentration of about 1 E 17 atoms/cm$^3$, producing net phosphorus type doping in the center of the channels of about 3 E 17 atoms/cm$^3$, which is approximately 33% lower than the concentration at the corner regions which is about 4 E 17 atoms/cm$^3$.

In accordance with another aspect of this invention, a semiconductor MOSFET device formed on a silicon substrate comprises a substrate including trenches. STI (Shallow Trench fill Isolation) dielectric trench structures of silicon dioxide fill the trenches and extend above the surface of the substrate. The trench fill structures having protruding sidewalls of the STI trench fill structures with channel regions in the substrate between the trench fill structures having corner regions adjacent to the STI trench fill structures. The channel regions between and adjacent to the STI trench fill structures are doped with one concentration of dopant in the centers of the channel regions, and a substantially higher concentration of dopant in the channel regions adjacent to the corner regions, the dopant concentration differential providing a substantially equal concentration of electrons in the centers and at the corner regions of the channel regions. Preferably, the device includes the parameters described above.

BRIEF DESCRIPTION OF THE DRAWINGS

The foregoing and other aspects and advantages of this invention are explained and described below with reference to the accompanying drawings, in which:

FIG. 2A is a sectional view of the device of FIGS. 2A–2E in an early stage of the manufacturing process. The device includes a lightly doped P− silicon semiconductor substrate for an NFET device is shown with a pad oxide layer over which is formed a pad silicon nitride layer patterned by the process of etching through openings in a photoresist trench mask with silicon trench openings therethrough down to the surface of the pad oxide layer.

FIG. 2B shows the product of FIG. 2A after the mask has been employed to etch the pad oxide layer and the substrate through the openings in the photoresist trench mask. The process of etching down through the pad oxide layer has formed trenches in the substrate.

FIG. 2C shows the product of FIG. 2B after a silicon dioxide (SiO$_2$) layer has been deposited in trenches in the substrate and in openings in the pad silicon nitride layer. The silicon dioxide layer has been patterned by polishing to form a set of STI, dielectric, trench fill structures.

FIG. 2D shows the device of FIG. 2C after the silicon trench fill mask was removed with the STI trench fill structures protruding above the surface of the substrate and a set of disposable sidewall spacers formed along the protruding sidewalls of the STI trench fill structures. Then follows an NFET compensating ion implantation of N-type ions into central channel regions located in the substrate aside from and between the STI trench fill structures and spacers.

FIG. 2E shows the device of FIG. 2D after the spacers have been removed by etching, following which P-type dopant ions are being implanted into regions between and adjacent to the STI trench fill structures to adjust the threshold voltage.

In FIG. 2F the device of FIG. 2E is shown after the pad oxide layer has been etched away and has been replaced by a gate oxide layer above the exposed surfaces of the substrate. A gate electrode layer is deposited and patterned into gate electrode conductor. Source/drain junctions are formed.

FIG. 2G shows a plan view of the device of FIG. 2F with a section line 2F–2F' indicating the section line along which FIGS. 2A–2F are taken. It can be seen that the gate electrode overlies the channel regions between the N+ doped source/drain regions above and below the channel regions.

FIGS. 2H and 2I are sections of the device taken along line 2I–2I' in FIG. 2G through a channel region with STI trench fill structures above and below the channel region and the source/drain N+ regions in FIG. 2G.

FIG. 2H shows the device of FIG. 2G after the gate oxide layer has been formed over the substrate and before the control gate electrode has been formed over layer with the P+ doped regions of FIG. 2F illustrated between the STI trench fill structures.

FIG. 2I shows the device of FIG. 2H after the gate electrode conductor has been formed with silicon dioxide sidewalls adjacent thereto and source and drain regions formed in the substrate adjacent to the gate electrode and sidewalls. The source and drain regions are self-aligned with the gate electrode and sidewalls. The corner regions having higher effective doping are seen in the edges of the source and drain regions where they abut the STI trench fill structures.

FIGS. 3A–3C show a set of STI trenches fabricated first using standard processes of which are the same as the process steps of FIGS. 2A–2C and the same structures have the same identification.

FIG. 3D shows the device of FIG. 3C after spacers have been formed by blanket deposition of a polysilicon spacer layer which has been etched to form the spacers on the sidewalls of STI trench fill structures of device of FIG. 3C. The polysilicon spacers have been doped with P type boron (B) dopant.

After the spacers are formed, PFET $V_T$ implants are performed. During this process, sidewalls are removed by CDE (Chemical Dry Etching) to prevent the sidewalls from doping the PFET.

After the PFET threshold voltage implants, the boron (B) from the spacer structures (that are now present only in the NFETs is diffused into regions on either side of STI trench fill structures and on the corner of the channels therebetween and/or aside therefrom using a hydrogen anneal which allows boron (B) to diffuse through the underlying sacrificial silicon oxide. After boron (B) diffusion and before the NFET threshold voltage implants, the polysilicon spacers are removed by CDE (Chemical Dry Etching).

Figure 3A:
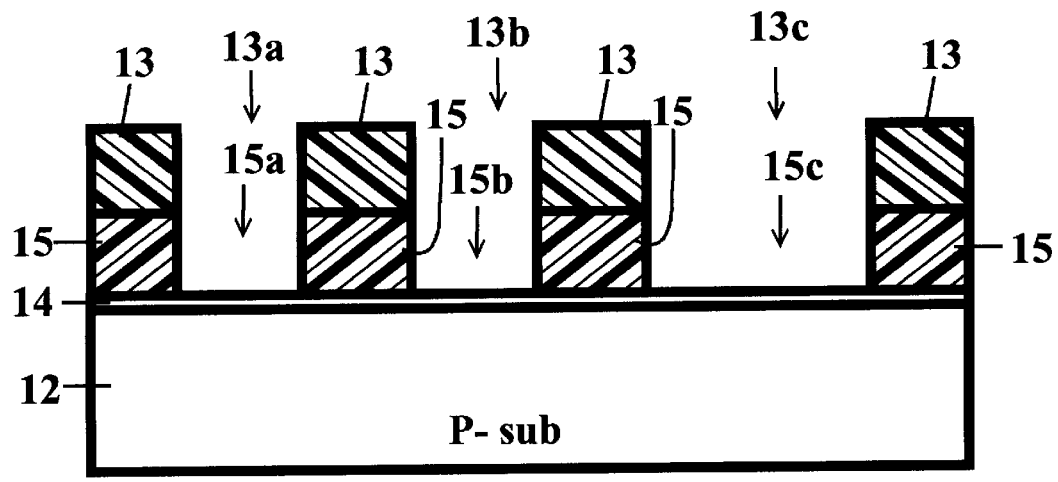
FIGS. 3A–3E show sectional views of a device being manufactured employing a second method in accordance with this invention.
Figure 3B:
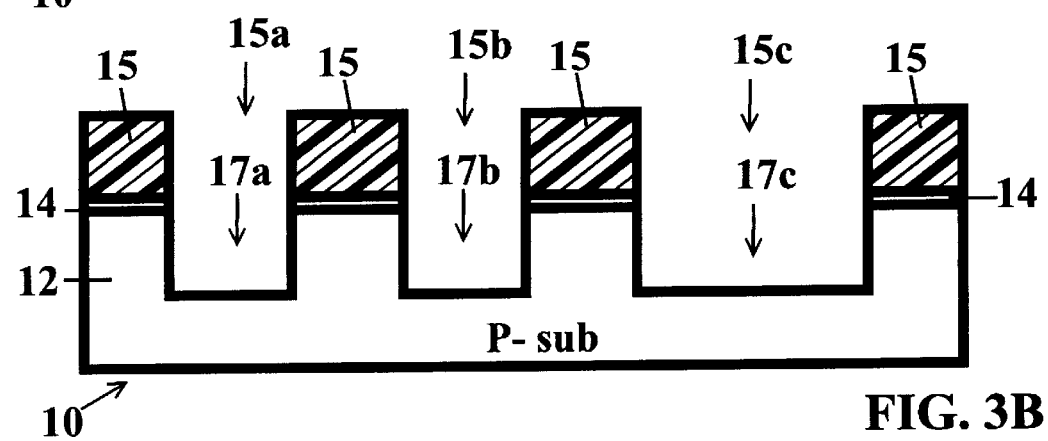
Figure 3C:
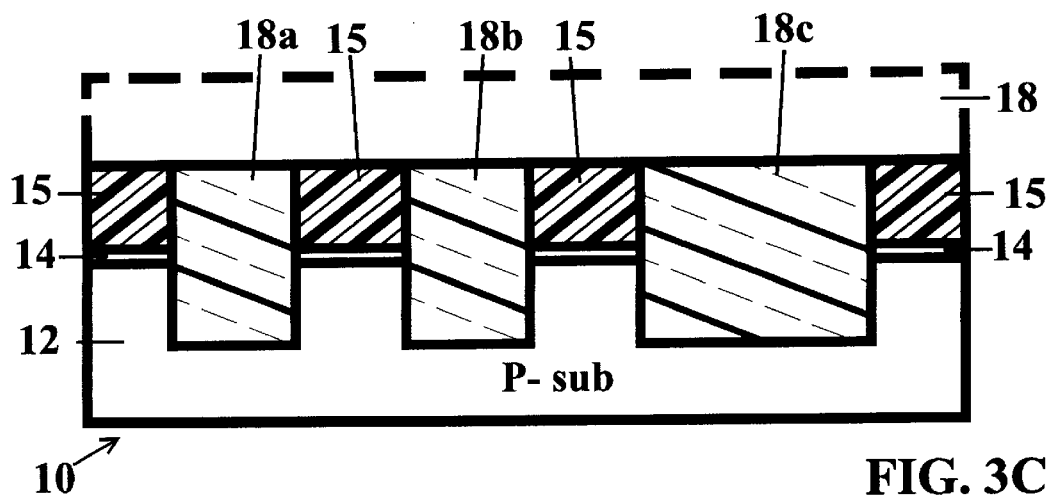
Figure 3D:
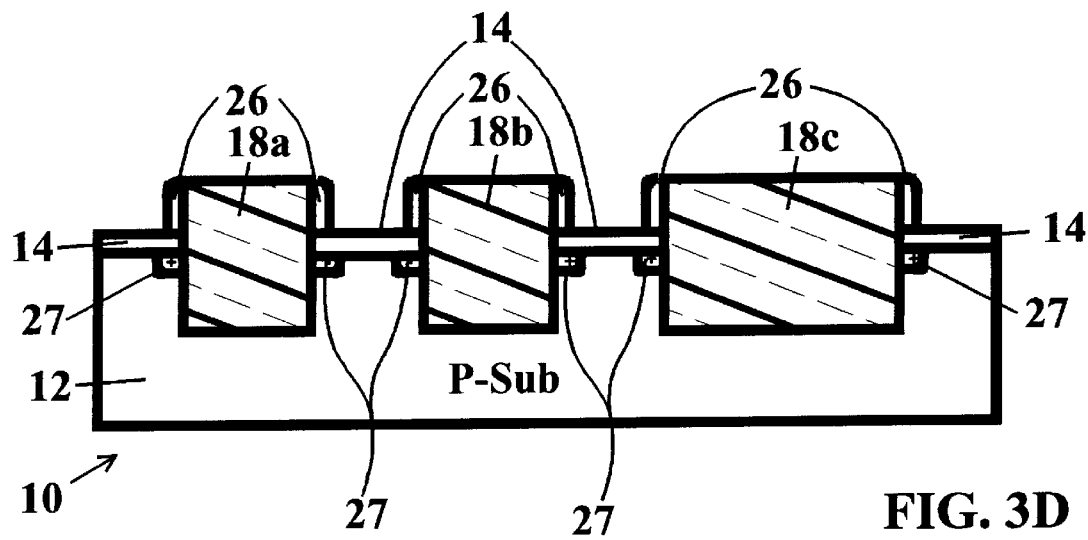
Figure 3E:
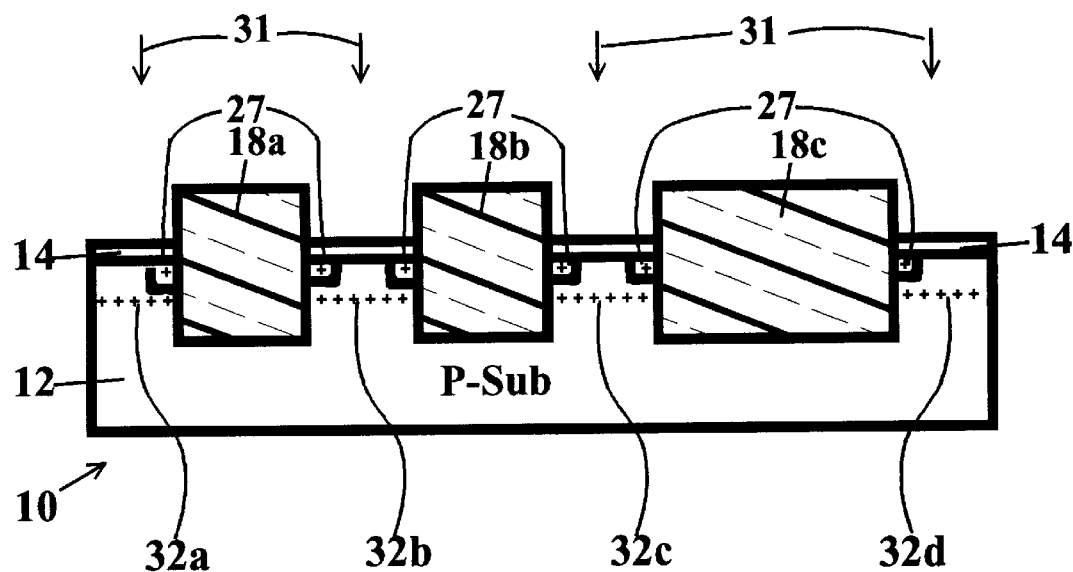

FIG. 3E shows the device of FIG. 3D after the spacer structures have been removed by a subtractive process such as etching. For the NFET threshold voltage implants, P-type dopant ions, are implanted into regions between and adjacent to the STI trench fill structures to adjust the threshold voltage those regions. The threshold voltage doping process involves ion implanting boron (B) ions into the substrate.

FIGS. 4A–4G show sectional views of a device being manufactured employing a third method in accordance with this invention.

Figure 4A:
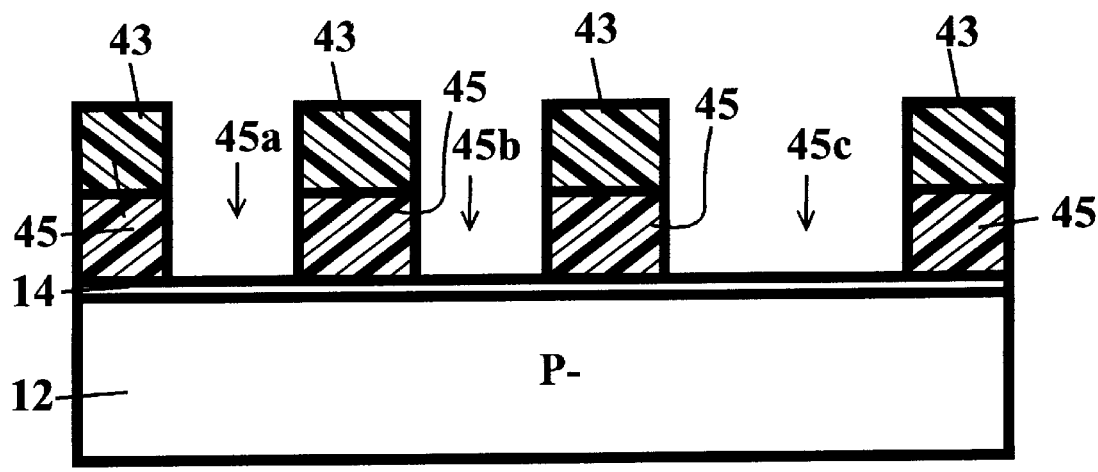

FIG. 4A shows a lightly doped P– silicon semiconductor substrate for an NFET device covered with a pad silicon oxide layer and a pad silicon nitride layer formed over the pad silicon oxide layer. In this method, the polish stops formed from the $Si_3N_4$ layer are patterned first as a mask with openings stopping on the underlying silicon oxide layer.

Figure 4B:
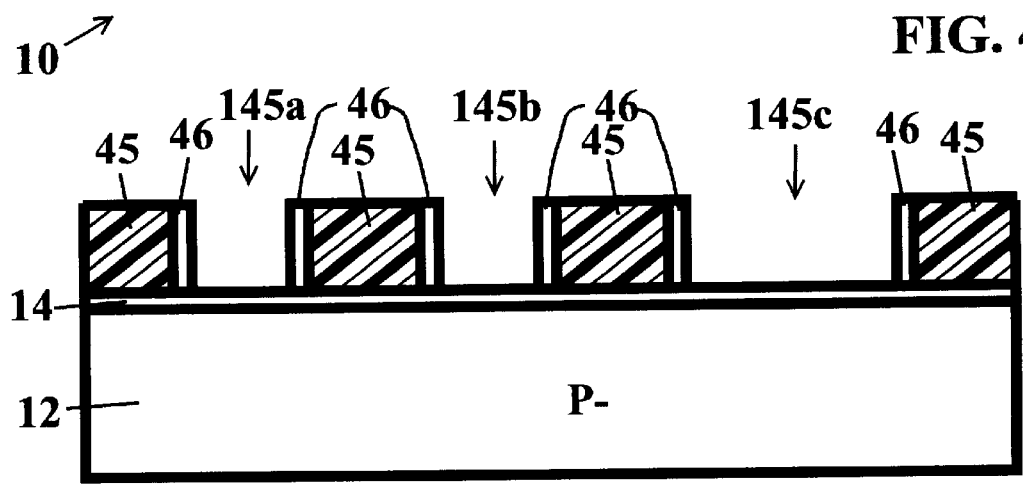

FIG. 4B shows the product of FIG. 4A after stripping the photoresist layer. A plurality of doped silicon oxide spacers are formed along the sidewalls of the $Si_3N_4$ layer.

Figure 4C:
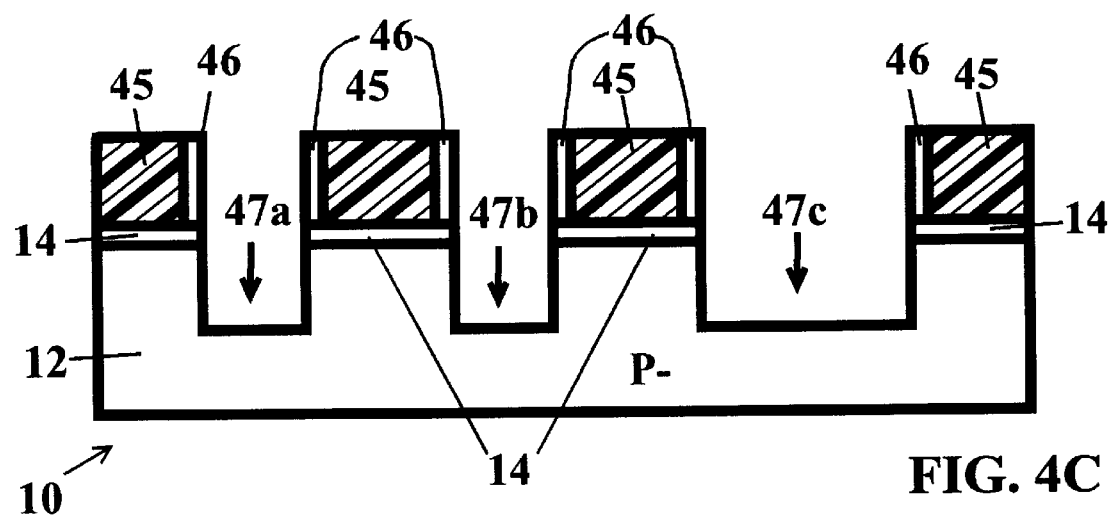

FIG. 4C shows the product of FIG. 4B after the $Si_3N_4$ layer and the doped silicon oxide spacers have been used as a mask with openings to etch through the pad silicon oxide layer down into silicon substrate to form the silicon trenches.

Figure 4D:
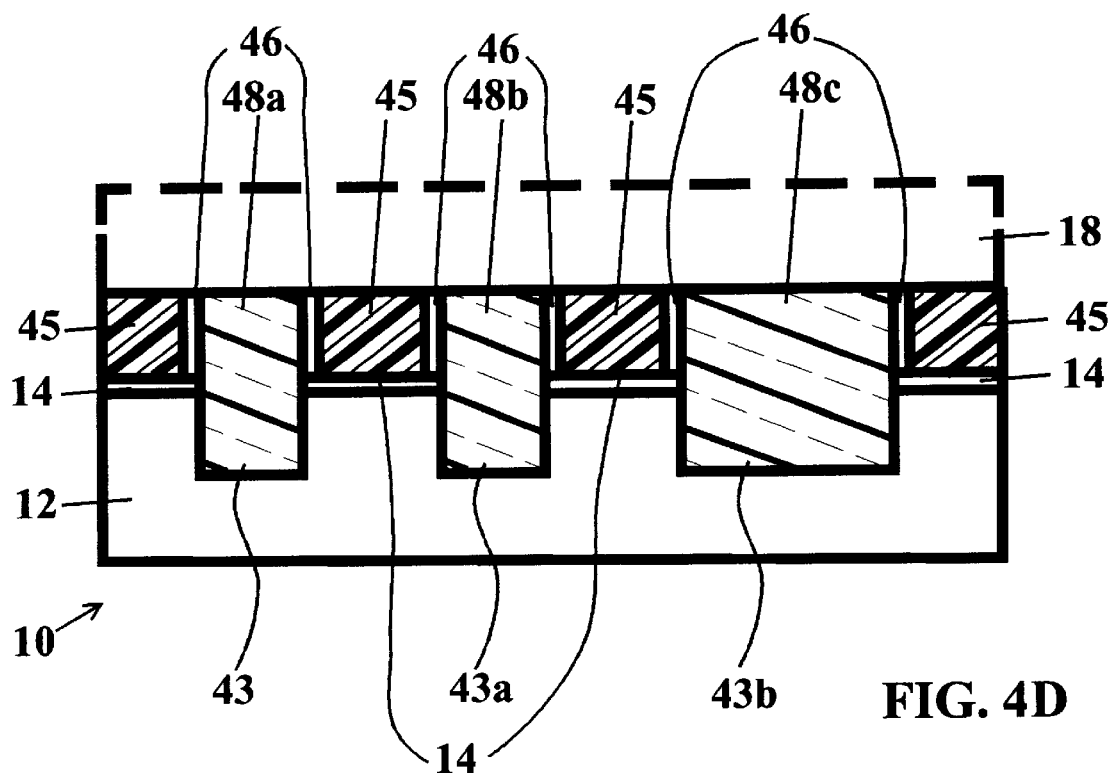

In FIG. 4D, the device of FIG. 4C is shown after a set of STI, dielectric, trench fill structures of silicon dioxide have been deposited in trenches in the substrate and in openings in the pad silicon nitride layer. The spacers have been reduced to shorter spacers on the low sidewalls of trench structures by the polishing step.

Figure 4E:
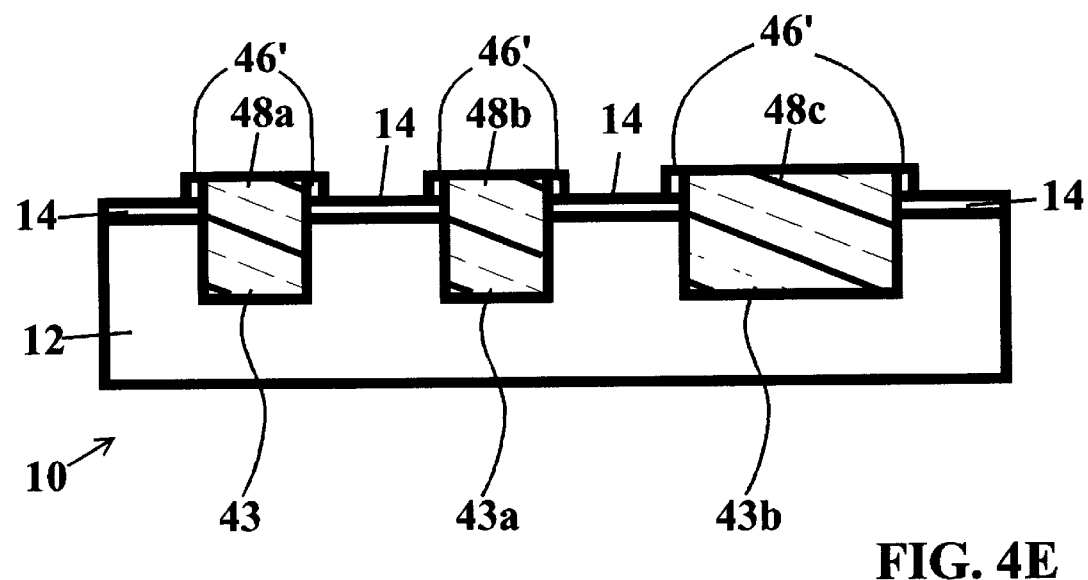

FIG. 4E shows the device of FIG. 4D after the pad nitride layer has been stripped from the device.

Figure 4F:
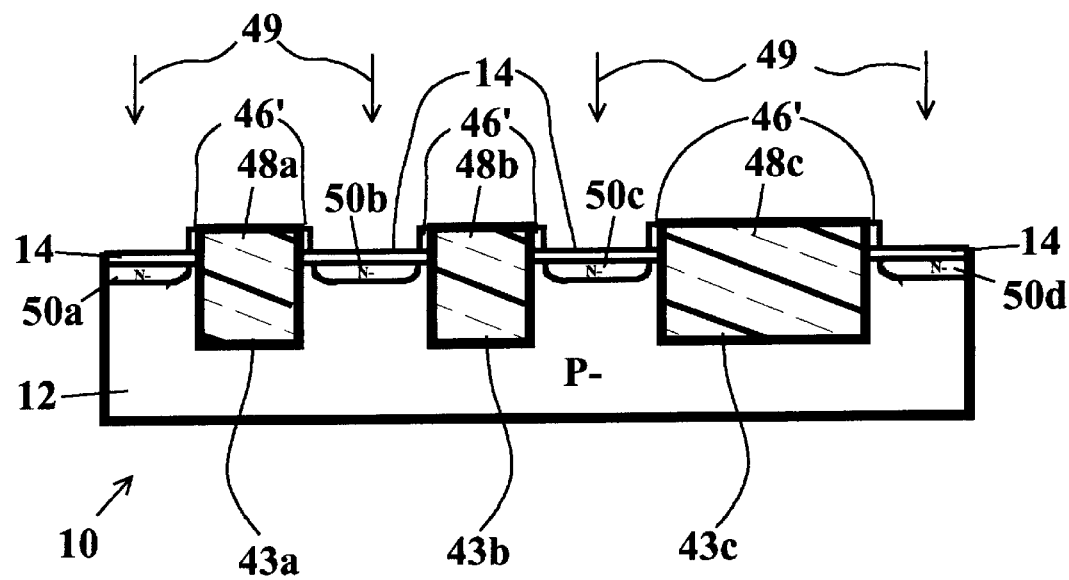

FIG. 4F shows the device of FIG. 4E during the NFET threshold voltage implant of an N-type dopant providing a compensating implant for compensation of the threshold voltage implant. The spacers block the compensating implant at the corners of the device in FIG. 4F.

Figure 4G:
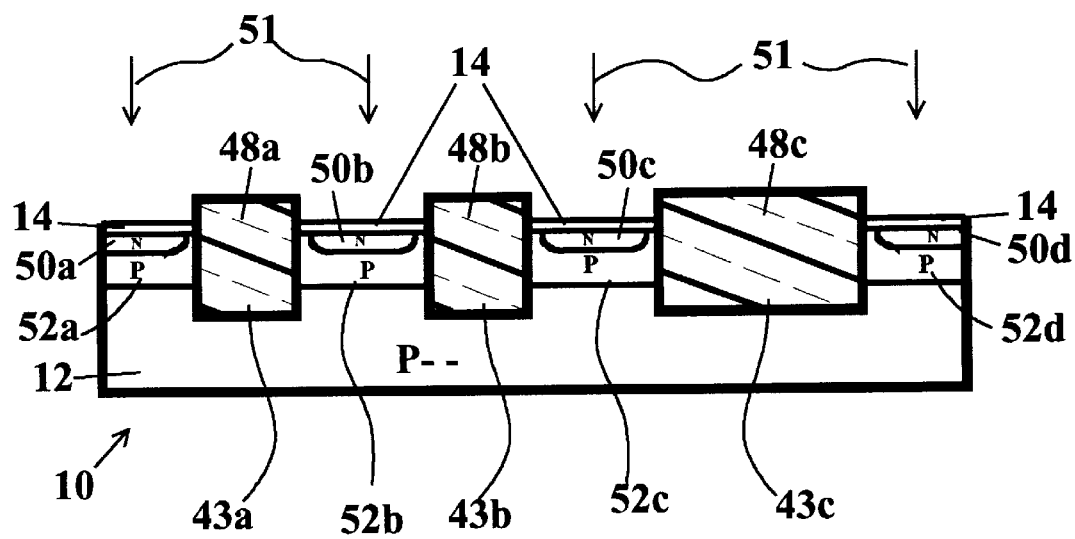

Next, in FIG. 4G, the spacers are removed and a P-type dopant such as boron (B) ions 51 are implanted to adjust the threshold voltage in FIG. 4G. The resist is stripped, then a similar process can be repeated on the PFETs if desired.

Figure 5:
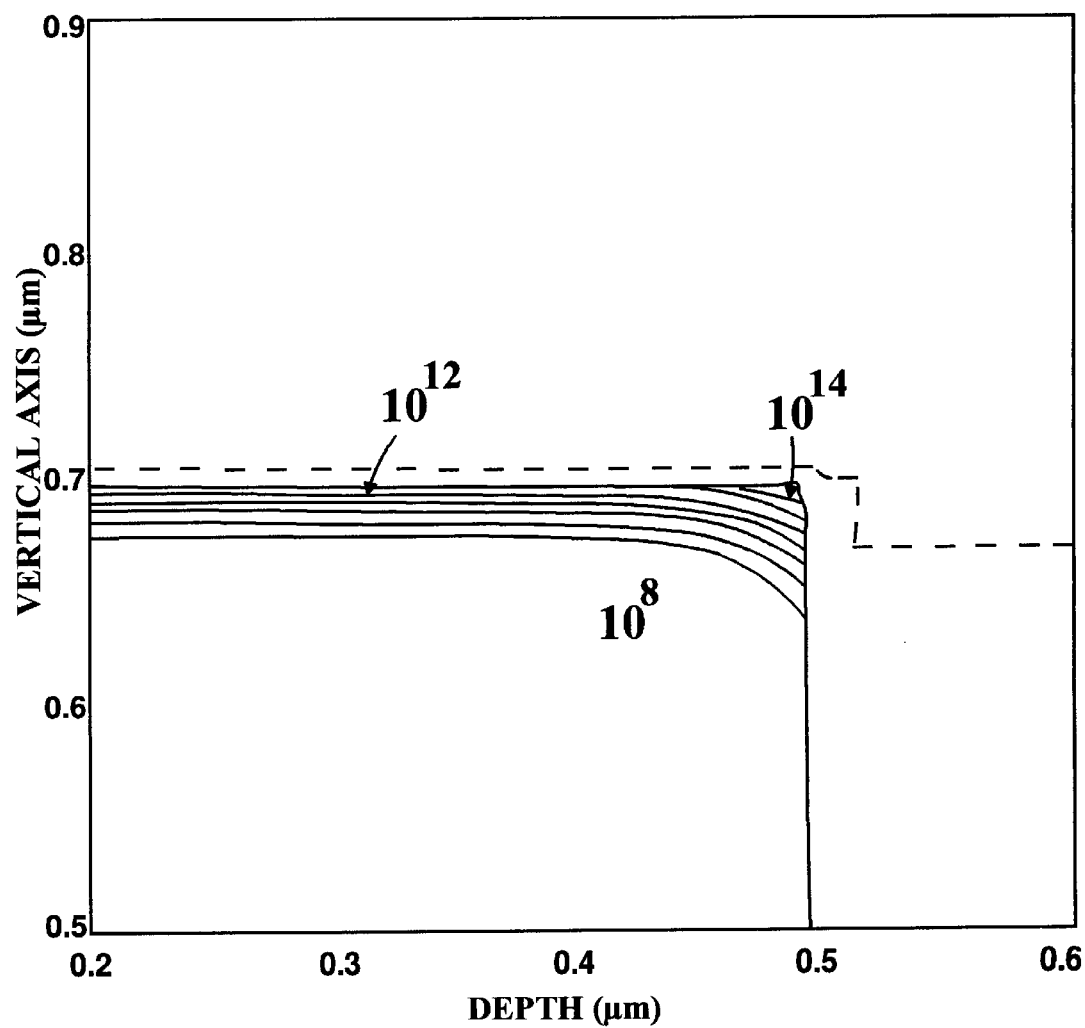

FIG. 5 is a graph which shows electron density contours of the device in the off-condition.

Figure 6:
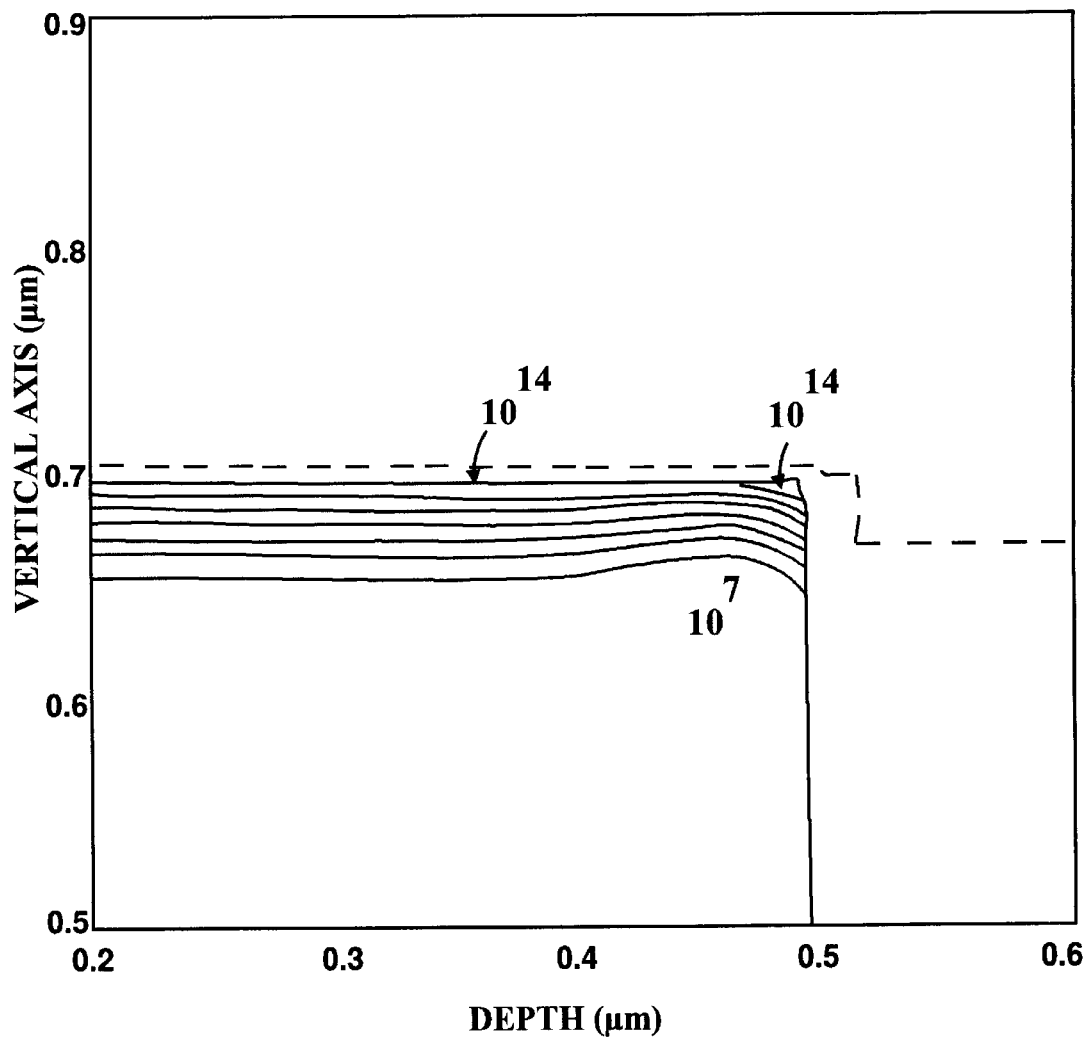

FIG. 6 shows simulated electron contours provided when a device has been manufactured in accordance with Method I described below.

DESCRIPTION OF THE PREFERRED EMBODIMENT

In accordance with this invention the threshold voltage is adjusted at the corner of the device in a way that requires no additional masks. Three ways to implement this process are described herein.

Method I
Disposable Spacer Along STI Region for Counterdoping

Figure 2A:
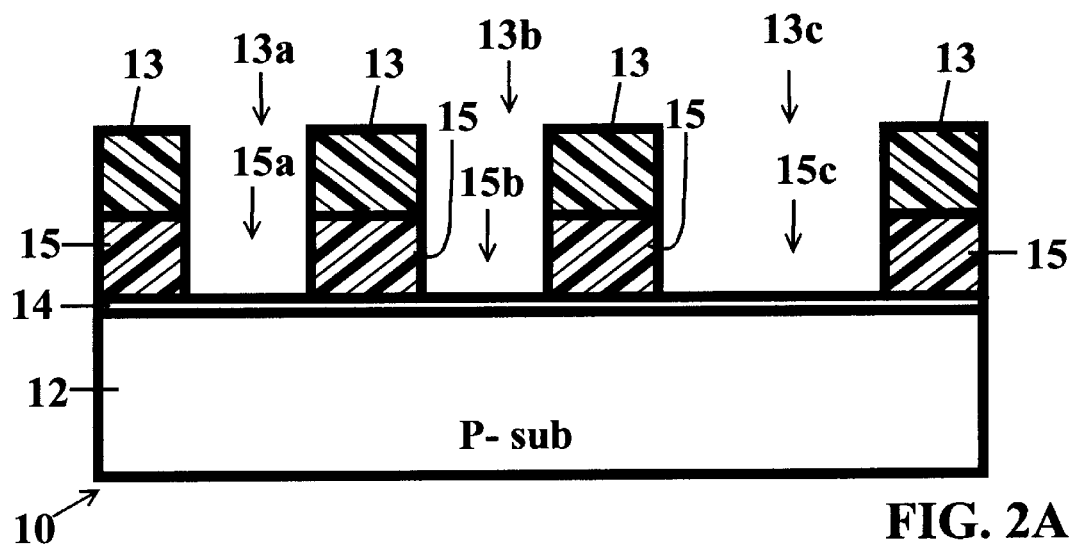
FIGS. 2A–2I show sectional views of a device being manufactured employing a first method in accordance with this invention.
Figure 2B:
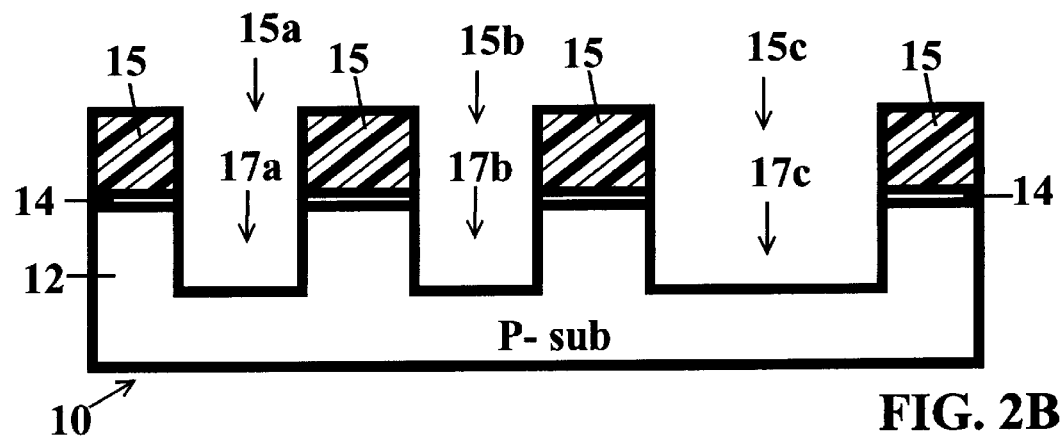
Figure 2C:
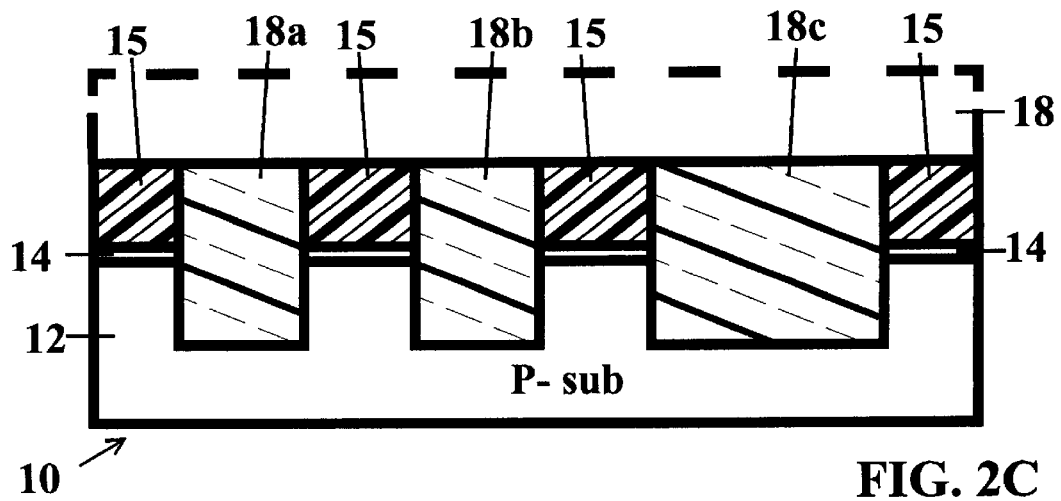

Referring to FIGS. 2A–2E, in accordance with this method, STI trench fill structures 18a–18c are formed by standard processing (FIGS. 2A–2C).

In FIG. 2A, a lightly doped P– silicon semiconductor substrate 12 for an NFET device is shown with a pad oxide layer 14 formed thereon. Over pad oxide layer 14, a silicon trench mask 15 is formed comprising a pad silicon nitride ($Si_3N_4$) layer having a thickness of from about 1,000 Å to about 5,000 Å (preferably 2,000 Å thick) has been formed. The silicon trench mask 15 has been patterned by the process of etching through openings 13a, 13b, and 13c in a photoresist mask 13 into the silicon trench mask 15 with openings 15a, 15b, and 15c therethrough down to the surface of the pad oxide layer 14. (As an alternative an N– doped substrate 12 can be employed with a PFET device, as will be understood by those skilled in the art.)

FIG. 2B shows the device 10 of FIG. 2A after the photoresist mask 13 has been stripped from device 10 (by a conventional method) and the silicon trench mask 15 has been employed to etch pad oxide layer 14 and substrate 12 through openings 15a, 15b, and 15c. The process of etching down through pad oxide layer 14 has formed trenches 17a, 17b, and 17c in the substrate 12 (below openings 15a, 15b, and 15c respectively) with a depth from about 1,000 Å to about 3,000 Å, preferably about 2,000 Å.

FIG. 2C shows the product of FIG. 2B after layer 18 (shown in phantom) of silicon dioxide ($SiO_2$) has been been deposited on the substrate 12 and in the trenches 17a, 17b, and 17c in the substrate 12 and in openings 15a, 15b, and 15c in silicon trench mask 15 and over mask 15. Layer 18 grown by a conventional Low Pressure Chemical Vapor Deposition (LPCVD) process at a temperature from about 700° C. to about 800° C. in an atmosphere of TEOS (TetraEthylOrthoSilicate) and oxygen ($O_2$) gases.

Then, a conventional chemical/mechanical polishing step is performed on the device 10 to form a set of STI, dielectric, trench fill structures 18a, 18b and 18c. The polishing step provides the smooth surface seen in FIG. 2C. The polishing step leaves a thickness of silicon trench mask from about 500 Å to about 4,000 Å, preferably about 1,000 Å and the trench fill structures 18a–18c from about 2,000 Å to about 4,000 Å, preferably about 3,000 Å, extending about 1,000 Å above the surface of the silicon substrate 12.

Next, the silicon trench mask 15 (comprising the pad silicon nitride layer, as described above) is stripped from the device 10 by means of application thereto of a phosphoric acid ($H_3PO_4$) solution under a range of temperatures from about 50° C. to about 180° C.

Figure 2D:
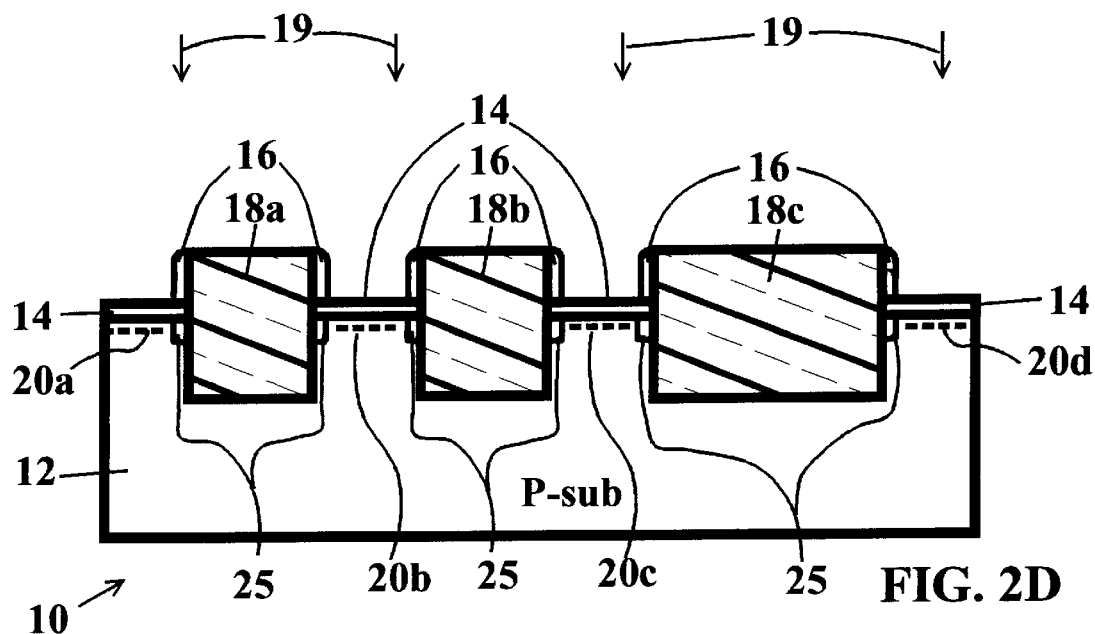

Referring to FIG. 2D, which shows shows the device 10 of FIG. 2C after the silicon trench mask 15 was removed, the STI trench fill structures 18a–18c protrude about 1,000 Å above the surface of silicon substrate 12; and a set of disposable sidewall spacers 16 have been formed as shown in FIG. 2D along the protruding sidewalls of STI trench fill structures 18a–18c. Spacers 16 were formed (after the pad nitride layer 16 was stripped away) by depositing a blanket sidewall spacer layer of $Si_3N_4$ or of undoped polysilicon from about 20 nm (200 Å) to about 100 nm (1,000 Å) thick over the structure of FIG. 2C. Then, in the conventional manner, the blanket sidewall spacer layer is patterned by reactive ion etching (RIE) into the configuration seen in FIG. 2D with the spacers 16 formed adjacent to the exposed, protruding sidewalls of STI trench fill structures 18a–18c.

During the NFET compensating ion implantation of N-type ions 19 into central channel regions 20, 20b, 20c and 20d, which are located in substrate 12 aside from and between the STI trench fill structures 18a–18c and spacers 16, as seen in FIG. 2D, the PFET region (not seen in the drawings) is masked with resist. N-type (arsenic) dopant ions 19 are ion implanted as the compensating implant, which is to compensate for the threshold voltage implant except for the corner regions 25 near the corners of substrate 12 at the sidewalls of STI trench structures 18a–18c, so that there will be higher effective doping in the corner regions 25 after the step of boron (B) doping in FIG. 2E with the N-doping ions 19 reducing the effect of a subsequent step of P-doping ions 21 in the channel regions. The spacers 16 blocked the compensating implant at the corners of the device aside from central channel regions 20a, 20b, 20c and 20d.

The sidewall spacers 16 are used as part of the self-aligned mask along with the STI trench fill structures 18a–18c during a subsequent self-aligned process of ion implanting to adjust the compensating of the substrate 12 in central channel regions 20a, 20b, 20c and 20d as shown in FIG. 2D. The compensating doping process involves ion implanting the arsenic ions 19 at an energy from about 1 keV to about 100 keV with a dose from about 1 E 12 ions/$cm^2$ to about 2 E 13 ions/$cm^2$, and typically 60 keV with a dose of about 2.5 E 12 ions/$cm^2$. The depth of the peak of the arsenic compensating implant in the central channel regions 20a, 20b, 20c and 20d is from about 100 Å to about 1,500 Å, typically about 450 Å deep below the surface of substrate 12.

After annealing of the device 10, the peak N type dopant concentration, comprising arsenic atoms, in the central channel regions 20a, 20b, 20c and 20d of the channels in substrate 12 is from about 5 E 16 atoms/$cm^3$ to about 2 E 18 atoms/$cm^3$, with a preferred concentration of about 1 E 17 atoms/$cm^3$.

Figure 1:
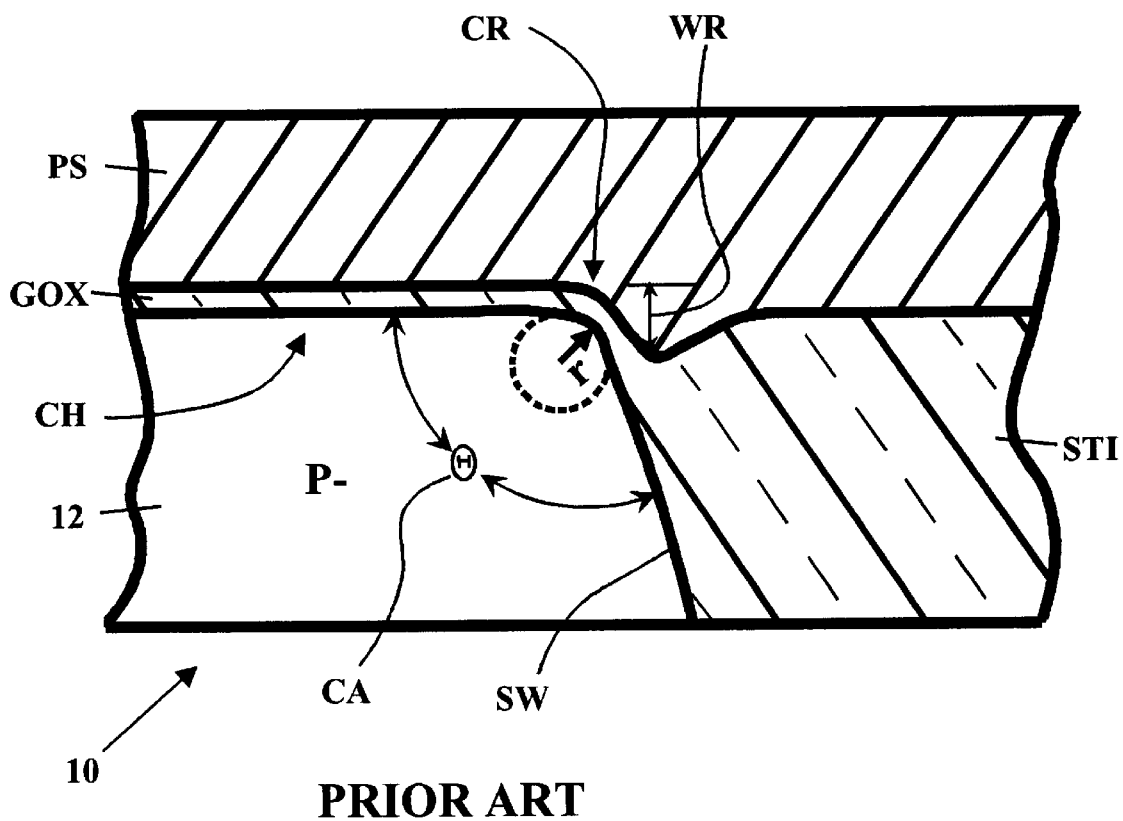
FIG. 1 shows a sectional view of a prior art semiconductor device formed on a semiconductor substrate covered by a gate oxide layer over a channel. To the right of the gate oxide layer is an isolation region separated from the substrate by a sidewall which forms a corner with a radius r and a corner angle of θ with the lower surface of the gate oxide layer. The corner has a lower threshold voltage than the main device, which can lead to a high "off" current and to variations in the threshold voltage of the transistor.
Figure 2E:
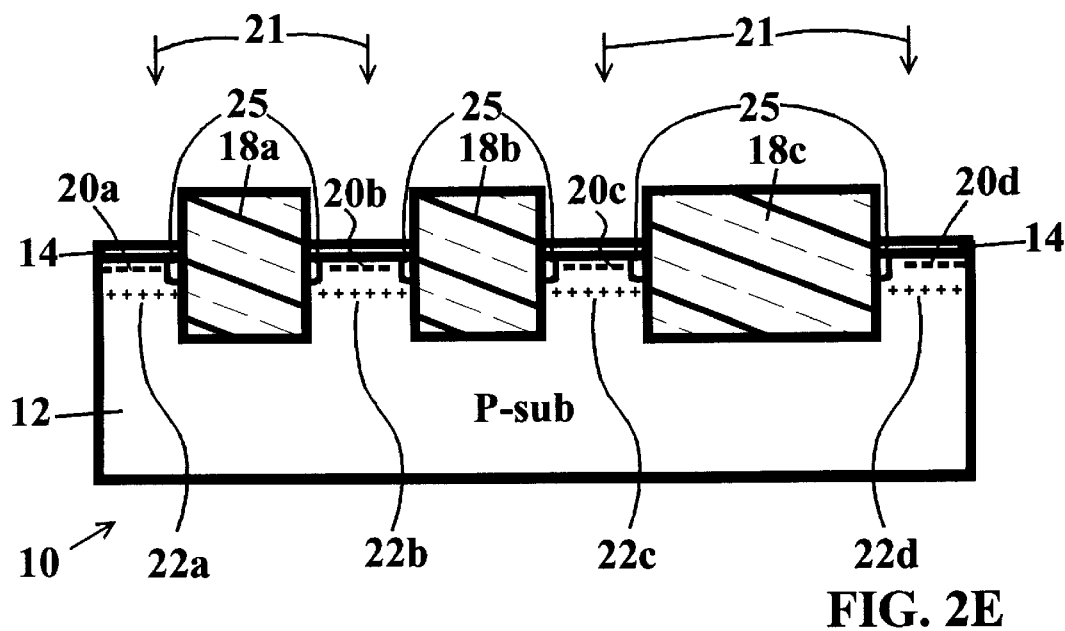

FIG. 2E shows the device of FIG. 2D after the spacers 16 have been removed, for example by Chemical Dry Etching (CDE) which is described in Kastenmeier et al "Chemical Dry Etching of Silicon Nitride and Silicon Dioxide Using $CF_4/O_2/N_2$ Gas Mixtures", J. Vac. Sci. Technol., A. 14(5), (September/October 1996) pp. 2802–2813, with particular reference to FIG. 1 which shows the apparatus and FIG. 3 which shows the high etch rate for silicon (Si) in $CF_4$ (Carbon Tetra Fluoride.)

Note that CDE is also often referred to as "downstream etching", because the wafers are etched downstream from where the plasma is generated.

Referring again to FIG. 2E, P-type dopant ions, are being implanted into channel regions 22a, 22b, 22c and 22d between and adjacent to the STI trench fill structures 18a–18c to adjust the threshold voltage in channel regions 22a, 22b, 22c and 22d.

The threshold voltage doping process involves ion implanting boron (B) ions 21 into the substrate 12 at an energy from about 1 keV to about 50 keV with a dose from about 1 E 12 ions/$cm^2$ to about 5 E 13 ions/$cm^2$, and typically 10 keV with a dose of about 8 E 12 ions/$cm^2$. The depth of the peak boron (B) concentration channel regions 22a, 22b, 22c and 22d is from about 200 Å to about 2,000 Å, typically about 500 Å deep below the surface of substrate 12. The peak concentration of P type dopant, comprising boron (B) atoms, produced in the channel regions 22a, 22b, 22c and 22d in substrate 12 is from about 1 E 17 atoms/$cm^3$ to about 3 E 18 atoms/$cm^3$ with a preferred concentration of about 4 E 17 atoms/$cm^3$.

If the arsenic doping in the channels has a concentration of about 1 E 17 atoms/$cm^3$, then this produces a net phosphorus type doping in the center of the channels of about 3 E 17 atoms/$cm^3$, which is approximately 33% lower than the concentration at the corners which is about 4 E 17 atoms/$cm^3$. This process equalizes the electron concentration at the centers and at the corners of the channels. Instead of having a 100× (two orders of magnitude) higher concentration of electrons at the centers of the channels, with respect to the center of the channels, there are now equal concentrations of electrons in those two regions as seen below in the discussion of simulations of devices in accordance with this invention.

Then the resist is stripped from the N-channel region. In a supplementary process or an alternate process similar steps can be repeated on the PFET regions, if desired. Otherwise, the sidewalls can be stripped from the PFET devices after the resist is stripped. The PFET spacers were masked during the CDE etching in the NFET region.

Figure 2F:
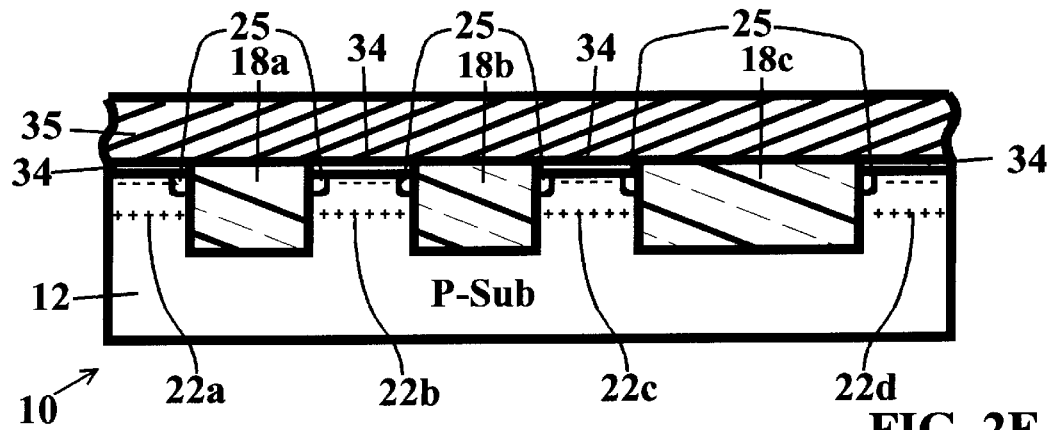

In FIG. 2F the device of FIG. 2E is shown after the pad oxide layer 14 has been etched away and has been replaced by a gate oxide layer 14 above the exposed surfaces of the substrate 12. In turn, a gate electrode, doped polysilicon layer is deposited and patterned into gate electrode conductor 35. Finally, source/drain junctions are formed by implantation and annealing as will be well understood by those skilled in the art.

Figure 2G:
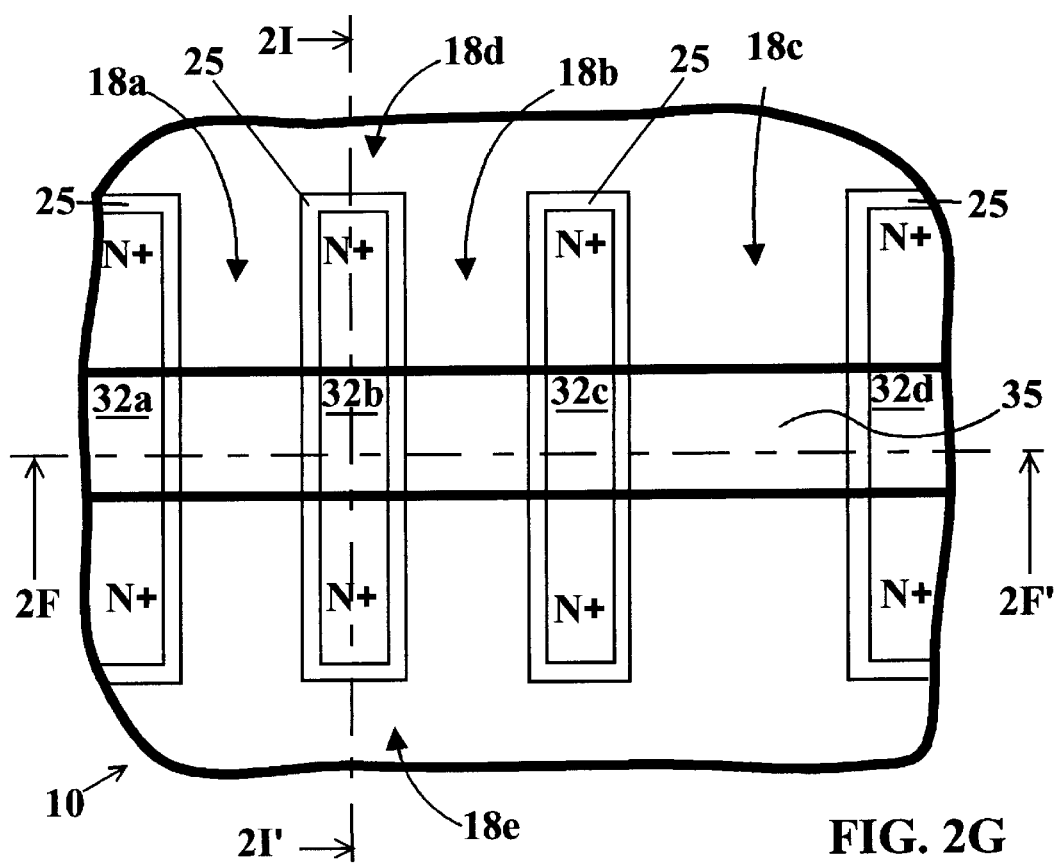

FIG. 2G shows a plan view of the device 10 of FIG. 2F with a section line 2F–2F' indicating the section line along which FIGS. 2A–2F are taken. It can be seen that the gate electrode 35 overlies the channel regions 32a, 32b, 32c and 32d between the N+ doped source/drain regions above and below the channel regions.

Figure 2H:
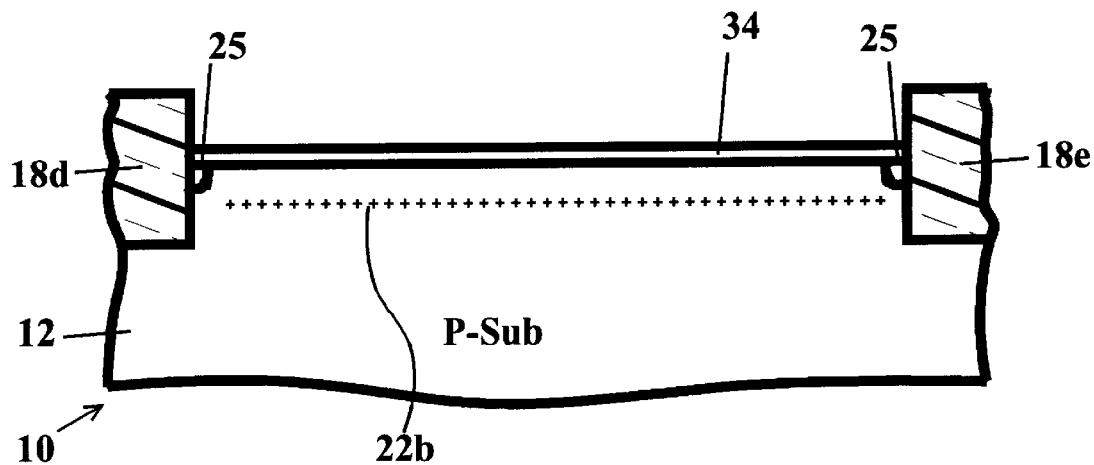
Figure 2I:
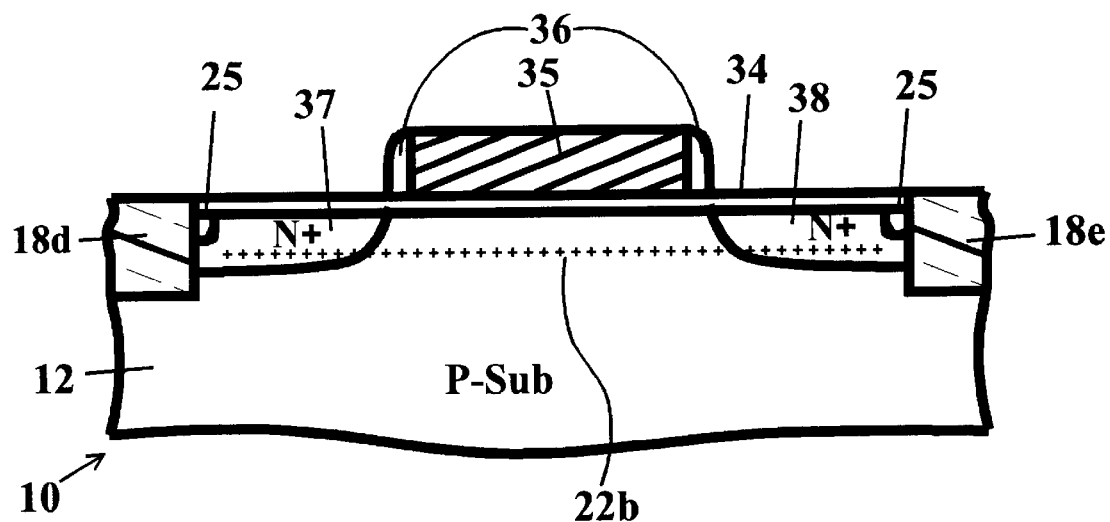

FIGS. 2H and 2I are sections of the device 10 taken along line 2I–2I' in FIG. 2G through channel region 32b with STI trench fill structures 18d and 18e above and below the channel region 32b and the source/drain N+ regions in FIG. 2G.

FIG. 2H shows the device of FIG. 2G after the gate oxide layer 34 has been formed over the substrate 12 and before the control gate electrode 35 has been formed over layer 34 with the P+ doped regions 22b of FIG. 2F illustrated between the STI trench fill structures 18d and 18e.

FIG. 2I shows the device of FIG. 2H after the gate electrode conductor 35 has been formed with silicon dioxide sidewalls 36 adjacent thereto and source and drain regions 37 and 38 formed in the substrate 12 adjacent to the gate electrode 35 and sidewalls 36. The source and drain regions 37 and 38 are self-aligned with the gate electrode 35 and sidewalls 36, as is conventional in the art. The corner regions 25 having higher effective doping (as explained above) are seen in the edges of the source and drain regions 37/38 where they abut the STI trench structures 18d and 18e. It should be noted that regions 25 have served their purpose in the step illustrated by FIG. 2F and serve no additional purpose in the steps shown in FIGS. 2H and 2I.

Method II

Disposable Spacer Along STI Trench Diffusion Source

Referring to the process of FIGS. 3A–3E, as with Method I, in the steps shown in FIGS. 3A–3C, a set of STI trenches 17a–17c were fabricated first using standard processes of which are the same as the process steps of 2A–2C and the same structures have the same identification.

Next, referring to FIG. 3D, spacers 26 have been formed by blanket deposition of a polysilicon spacer layer 26 which has been etched to form the spacers 26 on the sidewalls of STI trench fill structures 18a, 18b and 18c of device 10 of FIG. 3C. The polysilicon spacers 26 have been doped with P type boron (B) dopant with a concentration of boron (B) dopant atoms in spacers 26 of from about 1 E 19 atoms/cm³ to about 5 E 20 atoms/cm³. The spacer layer was deposited with a thickness from about 10 nm to about 100 nm and patterned into spacers 26 along the sidewalls of the STI trench fill structures 18a–18c.

After the spacers 26 are formed, PFET $V_T$ implants are performed. During this process, sidewalls in the PFET regions are removed by CDE (Chemical Dry Etching) to prevent the sidewalls from doping the PFET.

After the PFET threshold voltage implants, boron (B) from the spacer structures 26 (that are now present only in the NFETs is diffused into corner regions 27 on either side of STI trench fill structures 18a, 18b, and 18c on the corner of the channels therebetween and/or aside therefrom using an anneal, which allows boron (B) to diffuse through the underlying sacrificial-oxide. After boron (B) diffusion and before the NMOS FET threshold voltage implants, the polysilicon spacers 26 are removed by CDE (Chemical Dry Etching as shown in FIG. 3E.)

Preferably, the annealing process is performed in a hydrogen ($H_2$) gas atmosphere with a source such as forming gas at a temperature from about 800° C. and about 900° C. from about 60 seconds to about 30 minutes. Without a hydrogen atmosphere, the annealing process is performed at a temperature from about 900° C. and about 1,000° C. from about 60 seconds to about 30 minutes.

The resultant peak concentration of boron (B) dopant in the protected corner regions 27 in substrate 12 beneath the spacers 26 ranges from about 2 E 17 atoms/cm³ to about 2 E 18 atoms/cm³ in FIG. 3D and a concentration in the remainder of substrate 12 from about 1 E 17 atoms/cm³ to about 1 E 18 atoms/cm³ outside of the corner regions 27.

Referring again to FIG. 3E, for the NFET threshold voltage implants, P-type dopant ions 31, are being implanted into regions 32a, 32b, 32c and 32d between and adjacent to the STI trench fill structures 18a–18c to adjust the threshold voltage in regions 32a, 32b, 32c and 32d.

The threshold voltage doping process involves ion implanting boron (B) ions 31 into the substrate 12 at an energy from about 1 keV to about 50 keV with a dose from about 1 E 12 ions/cm² to about 5 E 13 ions/cm², and typically 10 keV with a dose of about 8 E 12 ions/cm². The depth of the peak boron (B) concentration in regions 32a, 32b, 32c and 32d is from about 200 Å to about 2,000 Å, typically about 500 Å deep below the surface of substrate 12.

After conventional source/drain high temperature annealing of the device 10, the concentration of P-type dopant, comprising boron (B) atoms, produced in the regions 32a, 32b, 32c, and 32d in substrate 12 is from about 5 E 16 atoms/cm³ to about 1 E 18 atoms/cm³.

Method III

Disposable Spacer Along $Si_3N_4$ Polish Stop for Counter-doping

In FIG. 4A, the lightly doped P– silicon semiconductor substrate 12 for an NFET device is shown with a pad silicon oxide layer 14 formed thereon. A pad silicon nitride ($Si_3N_4$) layer 45 having a thickness of from about 1,000 Å to about 5,000 Å (preferably 2,000 Å thick) has been formed over pad silicon oxide layer 14. In this method, the polish stops formed from $Si_3N_4$ layer 45 are patterned first as a mask with openings 45a, 45b, and 45c, stopping on the underlying pad silicon oxide layer 14.

Referring to FIG. 4B, after stripping the photoresist layer 43, a plurality of doped-silicon oxide spacers 46 composed of PhosphoSilicate Glass (PSG) or BoroSilicate Glass (BSG) are formed along the sidewalls of the $Si_3N_4$ layer 45.

FIG. 4C shows the product of FIG. 4B after the $Si_3N_4$ layer 45 and doped-silicon oxide spacers 46 have been used as a mask with openings 145a, 145b, and 145c to etch through the pad silicon oxide layer 14 down into silicon substrate 12 to form the silicon trenches 47a, 47b and 47c.

In FIG. 4D, the device of FIG. 4C is shown after a silicon dioxide ($SiO_2$) layer 48 (shown partially in phantom) has been deposited in trenches 47a, 47b, and 47c in the substrate 12 and in openings 145a, 145b, and 145c in pad silicon nitride ($Si_3N_4$) layer 45. The silicon dioxide ($SiO_2$) layer 48 includes trench fill structures 48a, 48b and 48c which are grown by a conventional Low Pressure Chemical Vapor Deposition (LPCVD) process at a temperature from about 700° C. to about 800° C. in an atmosphere of TEOS (TetraEthylOrthoSilicate) and oxygen ($O_2$) gases.

There is a conventional chemical/mechanical polishing step applied to the device to form STI, dielectric, trench fill structures 48a, 48b and 48c. The polishing results in trench fill structures 48a, 48b and 48c which have smooth surfaces, as seen in FIG. 4D. The polishing step leaves a thickness of pad silicon nitride layer 45 from about 500 Å to about 4,000 Å, preferably about 1,000 Å and the trench fill structures 48a–48c from about 2,000 Å to about 4,000 Å, preferably about 3,000 Å, extending about 1,000 Å above the surface of the silicon substrate 12. The spacers 46 have been reduced to shorter spacers 46' on the low sidewalls of trench fill structures 48a–48c, by the polishing step.

FIG. 4E shows the device of FIG. 4D after the pad nitride layer 45 has been stripped from the device 10 by means of phosphoric acid ($H_3PO_4$) under a range of temperatures from about 50° C. to about 180° C.

FIG. 4F shows the device of FIG. 4E, as in Method I, during the NFET threshold voltage implant, the PFET region is masked with resist. Then an N-type dopant 49 is implanted providing a compensating implant for compensation of the threshold voltage implant. The spacers 46' block the compensating implant at the corners of the device 10 in FIG. 4F.

Method III is similar to Method I in many respects and the compensating implant parameters and the threshold voltage doping process implant parameters are the same in terms of doses and concentrations of dopant and those values are incorporated here by reference. The depths and other parameters are also the same.

Next, in FIG. 4G, the spacers 46' are removed selectively to the $SiO_2$ by using dilute HF (which etches doped oxides up to 10× faster than undoped oxides) and a P-type dopant such as boron (B) ions 51 is implanted to adjust the threshold voltage in FIG. 4G. The resist is stripped, then a similar process can be repeated on the PFETs if desired.

Note that if B-doped $SiO_2$ is used for the spacers 46', then the threshold voltage can be adjusted by B-diffusion through the pad silicon oxide, (rather than implantation) similar to Method II. In this case, the PFET implants must be performed first so that the PFET is not doped by the spacers 46'. During the PFET threshold voltage implants, the spacers 46' are removed by a dilute HF etch. Before the NFET threshold voltage implants, the boron (B) from the spacers is diffused into the corner of the NFET channels using a hydrogen anneal, which allows boron (B) to diffuse through the underlying sacrificial oxide. After boron (B) diffusion, the spacers are removed from the NFET regions with dilute HF, and NFET threshold voltage implants are performed as in Method II.

For all three methods I, II and III, the resulting dopant profile in the channel of the NFET provides relatively high P-type doping at the corner (i.e., high threshold voltage) and relatively low P-type doping in the main channel (i.e., low threshold voltage). Ideally, this results in equal electron concentration in the corners and the centers of the channels, as will be shown in the next section. Hence, the transistor characteristics will be dominated by the main channel rather than the corner device, providing reproducible characteristics.

Simulation

A simulation of the invention has been performed to demonstrate operability. Simulations have been applied to the 256 Mb DRAM process for comparing the effect of the invention on the corner parasitic off-current in the NFET support device. The conclusions derived from the modeling are general in nature and also apply to other devices in other technologies.

Under certain process and design conditions (i.e. sharp corner, large gate wrap-around of corner, medium device width) corner conduction may contribute significantly to the off-current of the MOSFET, while not appreciably enhancing the on-current. Thus the channel doping must be adjusted to assure that the off-current objective is met despite the presence of corner conduction. This results in a loss of on-current relative to a device having no corner conduction.

Three methods for suppressing corner conduction have been described herein. The simulation results shown herein and described below demonstrate the operability of these methods.

Simulation Results

Base Case

Simulated doping contours in the width cross-section of a 1 $\mu$m wide standard support NFET (base case.) There is a sharp corner, 300A gate wrap-around and boron (B) depletion. These conditions result in severe corner conduction relative to conduction in the planar part of the device in the off condition.

FIG. 5 shows a graph of electron charge density contours of a device in the off-condition with a plot of charge density curves for the vertical axis ($\mu$m) vs. depth ($\mu$m). Note that the surface electron concentration is approximately two (2) orders of magnitude greater at the corner than near mid-width. If the current density within 500 Å of the corner is integrated and compared to the current in the rest of the device, it is found that $I_{off}$ due to corner conduction is approximately 16× the current in the planar portion.

In Method I there are disposable spacers formed along STI trench for counterdoping. A disposable spacer along the STI trench edge is used to block an arsenic implant into the surface of the channel. After removal of the spacer, a boron (B) implant is performed. The corners thus have higher P-type doping than the mid-width region.

In the case of simulated doping contours resulting from Method I, at the end of the process a spacer width of 500A, arsenic implant of 2.5E12 at 60 keV, and boron (B) implant of 8.0E12 at 10 keV have been selected. This combination serves to illustrate one possibility for increasing the corner doping while maintaining a lower $V_t$ in the planar portion of the device.

FIG. 6 shows simulated electron contours for Method I with a plot of charge density curves for the vertical axis ($\mu$m) vs. depth ($\mu$m). Note that the difference in electron concentration at the corner relative to the planar region has been reduced by two orders of magnitude relative to the base case. The ratio of the corner to planar currents is now 0.305 (compared to 16 for the base case), thus the corner is no longer the major contributor to $I_{off}$. The desired ratio of corner to planar current is easily obtained by appropriately adjusting the arsenic and boron (B) surface implant conditions.

In Method II, there is disposable spacer doping source along STI trench. In this option a disposable boron (B) doped polysilicon spacer is defined on the STI trench sidewall. The boron (B) is outdiffused from the polysilicon spacer by a hydrogen anneal and then removed. Normal processing follows.

Simulated doping contours resulting from Method II, at the end of the process, have been modeled, with boron (B) from a 500A wide polysilicon spacer (doped at 1E20) diffused through a 75A sacrificial oxide layer during a 910° C./fifteen (15) minute $H_2$ anneal. It has been demonstrated that the diffusivity of boron (B) in $SiO_2$ may be increased by 100× by a hydrogen ambient. The polysilicon spacers are removed after the anneal and normal processing continues.

Simulated electron contours have been determined for Method II. The electron concentration at the corner relative to the planar region has been significantly reduced. In this example the corner carries approximately the same amount of off-current as does the planar region of the device. Thus the corner is no longer the major contributor to $I_{off}$. The desired ratio of corner to planar current is easily obtained by appropriately adjusting either the boron (B) concentration in the polysilicon or the anneal conditions (temperature, time, $H_2$ concentration).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A semiconductor MOSFET device formed on a silicon substrate comprising:

said substrate including trenches,

STI (Shallow Trench Isolation) dielectric trench fill structures of silicon dioxide filling said trenches and extending above said surface of said substrate, said trench fill structures having protruding sidewalls of said STI trench fill structures with channel regions in said substrate between said trench fill structures having corner regions adjacent to said STI trench fill structures, said channel regions between and adjacent to said STI trench fill structures doped with one concentration of dopant in said centers of said channel regions, and a substantially higher concentration of dopant in said channel regions adjacent to said corner regions, said dopant concentration differential providing a substantially equal concentration of electrons in said centers and said corner regions of said channel regions.

2. A device in accordance with claim 1 wherein the peak concentration of P type dopant, comprising boron (B) atoms in the channel regions in said substrate is from about 1 E 17 atoms/cm$^3$ to about 3 E 18 atoms/cm$^3$ with a preferred concentration of about 4 E 17 atoms/cm$^3$.

3. A device in accordance with claim 1 wherein arsenic dopant in said channel regions has a concentration of about 1 E 17 atoms/cm$^3$, with net phosphorus type doping in said center of said channels of about 3 E 17 atoms/cm$^3$, which is approximately 33% lower than the concentration at said corner regions of about 4 E 17 atoms/cm$^3$.

4. A device in accordance with claim 3 wherein the peak concentration of P type dopant, comprising boron (B) atoms, in said channel regions in said substrate is from about 1 E 17 atoms/cm$^3$ to about 3 E 18 atoms/cm$^3$ with a preferred concentration of about 4 E 17 atoms/cm$^3$.

5. A device in accordance with claim 3 wherein arsenic doping in said channel regions has a concentration of about 1 E 17 atoms/cm$^3$, with net phosphorus type doping in said center of said channels of about 3 E 17 atoms/cm$^3$, which is approximately 33% lower than the concentration at said corner regions of about 4 E 17 atoms/cm$^3$.

6. A device in accordance with claim 5 wherein the resultant peak concentration of boron (B) dopant in said protected corner regions in said substrate ranges from about 2 E 17 atoms/cm$^3$ to about 2 E 18 atoms/cm$^3$ and a concentration of boron (B) dopant in the remainder of said substrate ranges from about 1 E 17 atoms/cm$^3$ to about 1 E 18 atoms/cm$^3$ outside of said corner regions.

7. A device in accordance with claim 1 wherein after source/drain high temperature annealing of said device the concentration of P-type dopant, comprising boron (B) dopant atoms in said channel regions in said substrate is from about 5 E 16 atoms/cm$^3$ to about 1 E 18 atoms/cm$^3$.

8. A device in accordance with claim 6 wherein after source/drain high temperature annealing of the device the concentration of P-type dopant, comprising boron (B) dopant atoms in said channel regions in said substrate is from about 5 E 16 atoms/cm$^3$ to about 1 E 18 atoms/cm$^3$.

9. A semiconductor MOSFET device formed on a silicon substrate comprising:

trenches formed in said substrate,

STI (Shallow Trench Isolation) dielectric trench fill structures formed in said trenches in said substrate and said dielectric trench fill structures extending above said substrate with protruding sidewalls formed on sides of portions of said STI trench fill structures extending above said surface of said substrate, channel regions formed in said substrate between said trench fill structures having corner regions adjacent to said STI trench fill structures, said channel regions being doped between and adjacent to said STI trench fill structures with one concentration of dopant in the centers of said channel regions, and a substantially higher concentration of dopant in said channel regions adjacent to said corner regions, said dopant concentration differential providing a substantially equal concentration of electrons in said centers and at said corner regions of said channel regions.

10. A semiconductor MOSFET device in accordance with claim 9 formed on a silicon substrate, comprising:

ions of a first type of dopant implanted as a compensating implant in said centers of channel regions, said centers being located in said substrate aside from said STI region trench fill structures, said compensating implant being in said centers of said channel regions to compensate for a threshold voltage implant except at said corner regions adjacent to said sidewalls of STI trench fill structures so that there will be higher effective doping in said corner regions blocking said compensating implant at said corner regions of said device aside from said central channel regions, and a threshold voltage doping of additional dopant implanted into said channel regions including said corner regions whereby said corner regions have a higher dopant concentration than said centers of said channel regions.

11. A semiconductor MOSFET device in accordance with claim 10 wherein said compensating doping implant comprises implanted arsenic ions.

12. A device in accordance with claim 10 wherein the depth of the peak of the arsenic compensating implant in said central channel regions is from about 100 Å to about 1,500 Å, typically about 450 Å deep below said surface of said substrate.

13. A device in accordance with claim 10 wherein said threshold voltage doping comprises boron (B) ions implanted with a dose from about 1 E 12 ions/cm$^2$ to about 5 E 13 ions/cm$^2$.

14. A device in accordance with claim 13 wherein the depth of the peak boron (B) concentration regions is from about 200 Å to about 2,000 Å.

15. A device in accordance with claim 13 wherein peak boron (B) concentration regions are about 500 Å deep below said surface of said substrate and said dose was about 8 E 12 ions/cm$^2$.

16. A device in accordance with claim 10 wherein peak concentration of P type dopant, comprising boron (B) atoms, produced in the channel regions in said substrate is from about 1 E 17 atoms/cm$^3$ to about 3 E 18 atoms/cm$^3$ with a preferred concentration of about 4 E 17 atoms/cm$^3$.

17. A device in accordance with claim 10 wherein arsenic doping in said channel regions has a concentration of about 1 E 17 atoms/cm$^3$, producing net phosphorus type doping in said center of said channels of about 3 E 17 atoms/cm$^3$, which is approximately 33% lower than the concentration at said corner regions which is about 4 E 17 atoms/cm$^3$.

18. A device in accordance with claim 13 wherein:

the peak concentration of P type dopant, comprising boron (B) atoms, produced in the channel regions in said substrate is from about 1 E 17 atoms/cm$^3$ to about 3 E 18 atoms/cm$^3$ with a preferred concentration of about 4 E 17 atoms/cm$^3$.

19. A device in accordance with claim 11 wherein arsenic doping in said channel regions has a concentration of about 1 E 17 atoms/cm$^3$, with net phosphorus type doping in said center of said channels of about 3 E 17 atoms/cm$^3$, which is approximately 33% lower than the concentration at said corner regions which is about E 17 atoms/cm$^3$.

20. A device in accordance with claim 9, further, comprising:

corner dopant diffused into said corner regions of NFET channel regions in said device, said centers of said channel regions being located in said substrate spaced aside from and between said STI region trench fill structures, and an opposite type of dopant ions implanted into said channel regions including said corner regions whereby said corner regions have a higher effective dopant concentration of atoms of said opposite type of dopant.

21. A device in accordance with claim 20 wherein the peak concentration of boron (B) dopant in said corner regions in said substrate ranges from about 2 E 17 atoms/cm$^3$ to about 2 E 18 atoms/cm$^3$ and a concentration in the remainder of said substrate aside from said corner regions from about 1 E 17 atoms/cm$^3$ to about 1 E 18 atoms/cm$^3$.

22. A device in accordance with claim 20 wherein:
said substrate includes a threshold voltage region doped with boron (B) ions implanted with a dose from about 1 E 12 ions/cm$^2$ to about 5 E 13 ions/cm$^2$, and
the depth of the peak boron (B) concentration in said substrate is from about 200 Å to about 2,000 Å.

23. A device in accordance with claim 20 wherein:
said substrate includes a threshold voltage region doped with boron (B) ions implanted into said substrate with a dose of about 8 E 12 ions/cm$^2$, and
the depth of the peak boron (B) concentration in said substrate is about 500 Å.

24. A device in accordance with claim 20 wherein after source/drain high temperature annealing of said device the concentration of P-type dopant, comprising boron (B) atoms, produced in said channel regions in said substrate is from about 5 E 16 atoms/cm$^3$ to about 1 E 18 atoms/cm$^3$.

25. A device in accordance with claim 21 wherein a threshold voltage doping region includes boron (B) ions implanted in said substrate with a dose of about 8 E 12 ions/cm$^2$, and the depth of the peak boron (B) concentration in said substrate is about 500 Å.

26. A device in accordance with claim 21 wherein after source/drain high temperature annealing of the device the concentration of P-type dopant, comprising boron (B) atoms, produced in said channel regions in said substrate is from about 5 E 16 atoms/cm$^3$ to about 1 E 18 atoms/cm$^3$.

27. A device in accordance with claim 22 wherein:
said threshold voltage doping involves boron (B) ions implanted into said substrate with a dose of about 8 E 12 ions/cm$^2$, and
the depth of the peak boron (B) concentration in said substrate is about 500 Å.

28. A device in accordance with claim 22 wherein after source/drain high temperature annealing of said device the concentration of P-type dopant, comprising boron (B) atoms, produced in the channel regions in said substrate is from about 5 E 16 atoms/cm$^3$ to about 1 E 18 atoms/cm$^3$.

29. A semiconductor MOSFET device formed on a silicon substrate in accordance with claim 9, comprising:
trenches etched down into said substrate,
STI (Shallow Trench Isolation) dielectric trench fill structures of silicon dioxide filling said trenches in said substrate and extending above said trenches,
ions of a first type of dopant implanted as a compensating implant into said centers of channel regions, said centers being located in said substrate aside from said STI region trench fill structures,
said compensating implant being made in said centers of said channel regions to compensate for the threshold voltage implant except at said corner regions adjacent to said sidewalls of STI trench fill structures providing a higher effective doping in said corner regions of said device aside from said central channel regions, and
an opposite type of dopant ions implanted into said channel regions including said corner regions whereby said corner regions have a higher effective dopant concentration of atoms of said opposite type of dopant.

30. A device in accordance with claim 29 wherein the depth of the peak of said compensating implant in said central channel regions comprises arsenic dopant from about 100 Å to about 1,500 Å, typically about 450 Å deep below said surface of said substrate.

31. A MOSFET device on a silicon substrate in accordance with claim 29 wherein said threshold voltage doping involves boron (B) ions implanted with a dose from about 1 E 12 ions/cm$^2$ to about 5 E 13 ions/cm$^2$.

32. A device in accordance with claim 30 wherein the depth of the peak boron (B) concentration regions is from about 200 Å to about 2,000 Å.

33. A device in accordance with claim 30 wherein said energy is about 10 keV and said dose is about 8 E 12 ions/cm$^2$ and the peak boron (B) concentration regions is about 500 Å deep below the surface of said substrate.

34. A device in accordance with claim 32 wherein the peak concentration of P type dopant, comprising boron (B) atoms, produced in said channel regions in said substrate is from about 1 E 17 atoms/cm$^3$ to about 3 E 18 atoms/cm$^3$ with a preferred concentration of about 4 E 17 atoms/cm$^3$.

35. A device in accordance with claim 29 wherein arsenic doping in said channel regions has a concentration of about 1 E 17 atoms/cm$^3$, producing net phosphorus type doping in said center of said channels of about 3 E 17 atoms/cm$^3$, which is approximately 33% lower than the concentration at said corner regions which is about 4 E 17 atoms/cm$^3$.

36. A device in accordance with claim 30 wherein the peak concentration of P type dopant, comprising boron (B) atoms, produced in said channel regions in said substrate is from about 1 E 17 atoms/cm$^3$ to about 3 E 18 atoms/cm$^3$ with a preferred concentration of about 4 E 17 atoms/cm$^3$.

37. A device in accordance with claim 29 wherein arsenic doping in said channel regions has a concentration of about 1 E 17 atoms/cm$^3$, producing net phosphorus type doping in said center of said channels of about 3 E 17 atoms/cm$^3$, which is approximately 33% lower than the concentration at said corner regions which is about 4 E 17 atoms/cm$^3$.

38. A semiconductor MOSFET device comprising:
a silicon oxide, pad layer on a silicon substrate with threshold voltage implant in a channel region,
trenches etched down through said pad silicon oxide layer and into said substrate,
STI (Shallow Trench Isolation) dielectric layer, trench fill structures of silicon dioxide with smooth polished surfaces formed in said trenches in said substrate with sidewalls of said STI trench fill structures protruding above said pad silicon oxide layer,
a compensating implant formed by ions of a first type of dopant implanted into said centers of channel regions, said centers being located in said substrate aside from said STI region trench fill structures,
said compensating implant being made to compensate for said threshold voltage implant except at said corner regions near said corner regions of said channel regions at said sidewalls of STI trench fill structures so that there is higher effective doping in said corner regions blocking said compensating implant at said corner regions of said device aside from said central channel regions, and
an opposite type of dopant implanted into said channel regions including said corner regions whereby said corner regions have a higher effective dopant concentration of atoms of said opposite type of dopant.

39. A device in accordance with claim 38 wherein the depth of the peak of said compensating implant in said central channel regions comprises arsenic dopant from about 100 Å to about 1,500 Å, typically about 450 Å deep below said surface of said substrate.

40. A MOSFET device on a silicon substrate in accordance with claim 38 wherein threshold voltage implant involves boron (B) ions implanted with a dose from about 1 E 12 ions/cm$^2$ to about 5 E 13 ions/cm$^2$.

41. A device in accordance with claim 38 wherein the depth of the peak boron (B) concentration regions is from about 200 Å to about 2,000 Å.

* * * * *